United States Patent [19]

Kohno et al.

[11] Patent Number: 5,072,425
[45] Date of Patent: Dec. 10, 1991

[54] SEMICONDUCTOR MEMORY DEVICE FOR DECREASING OCCUPANCY AREA BY PROVIDING SENSE AMPLIFIER DRIVING LINES OVER SENSE AMPLIFIERS AND MEMORY CELLS

[75] Inventors: Tohru Kohno, Chiba; Taiji Ema, Kawasaki, both of Japan

[73] Assignee: Fujitsu Limited, Kawasaki, Japan

[21] Appl. No.: 539,658

[22] Filed: Jun. 13, 1990

[51] Int. Cl.$^5$ ............................................. G11C 13/00
[52] U.S. Cl. ..................................... 365/226; 365/63; 365/51
[58] Field of Search .................... 365/226, 63, 51, 205

[56] References Cited

U.S. PATENT DOCUMENTS 5,022,005 6/1991 Tomnishi ........................... 365/226

FOREIGN PATENT DOCUMENTS 59-129983 7/1984 Japan .

Primary Examiner—Terrell W. Fears
Attorney, Agent, or Firm—Armstrong, Nikaido, Marmelstein, Kubovcik & Murray

[57] ABSTRACT

A semiconductor memory device comprises first sense amplifier driving lines and second sense amplifier driving lines, the first sense amplifier driving lines are formed in a first wiring layer along the word line direction, and the second sense amplifier driving lines are formed in a second wiring layer along the bit line direction. Therefore, a current flowing in the each of the first sense amplifier driving lines becomes small, and the width of the first sense amplifier driving lines becomes small, so that occupancy area of the semiconductor memory device can be decreased and a large scale integration can be realized.

21 Claims, 31 Drawing Sheets

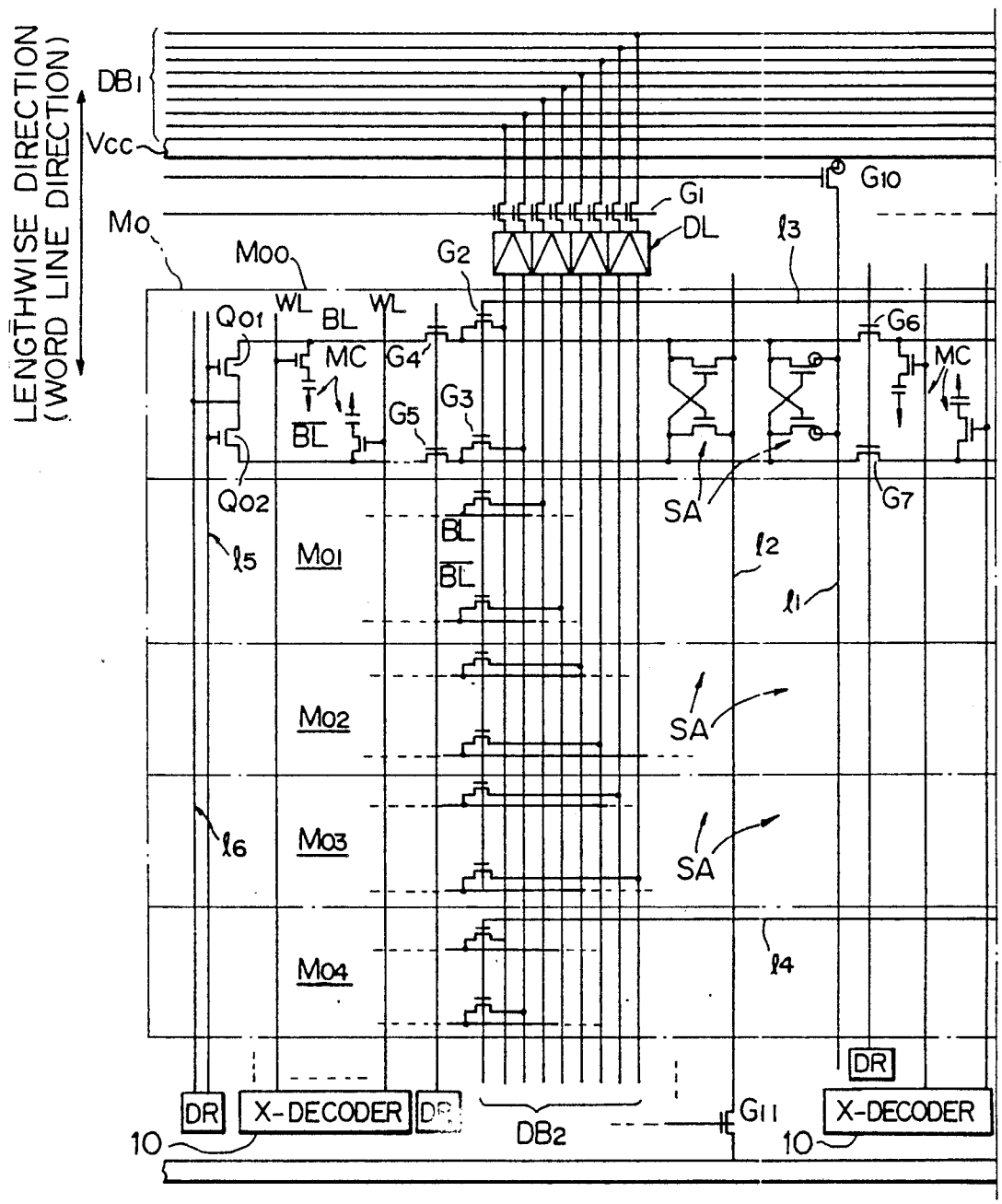

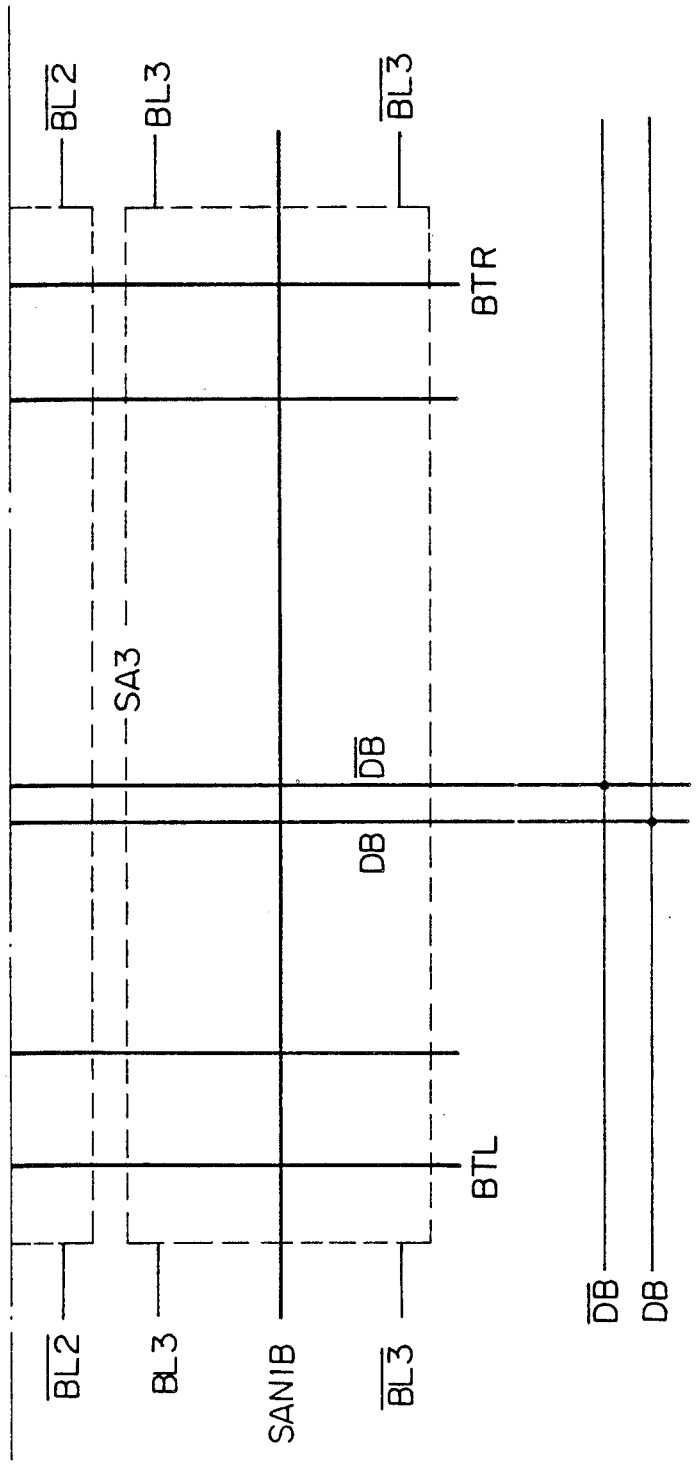

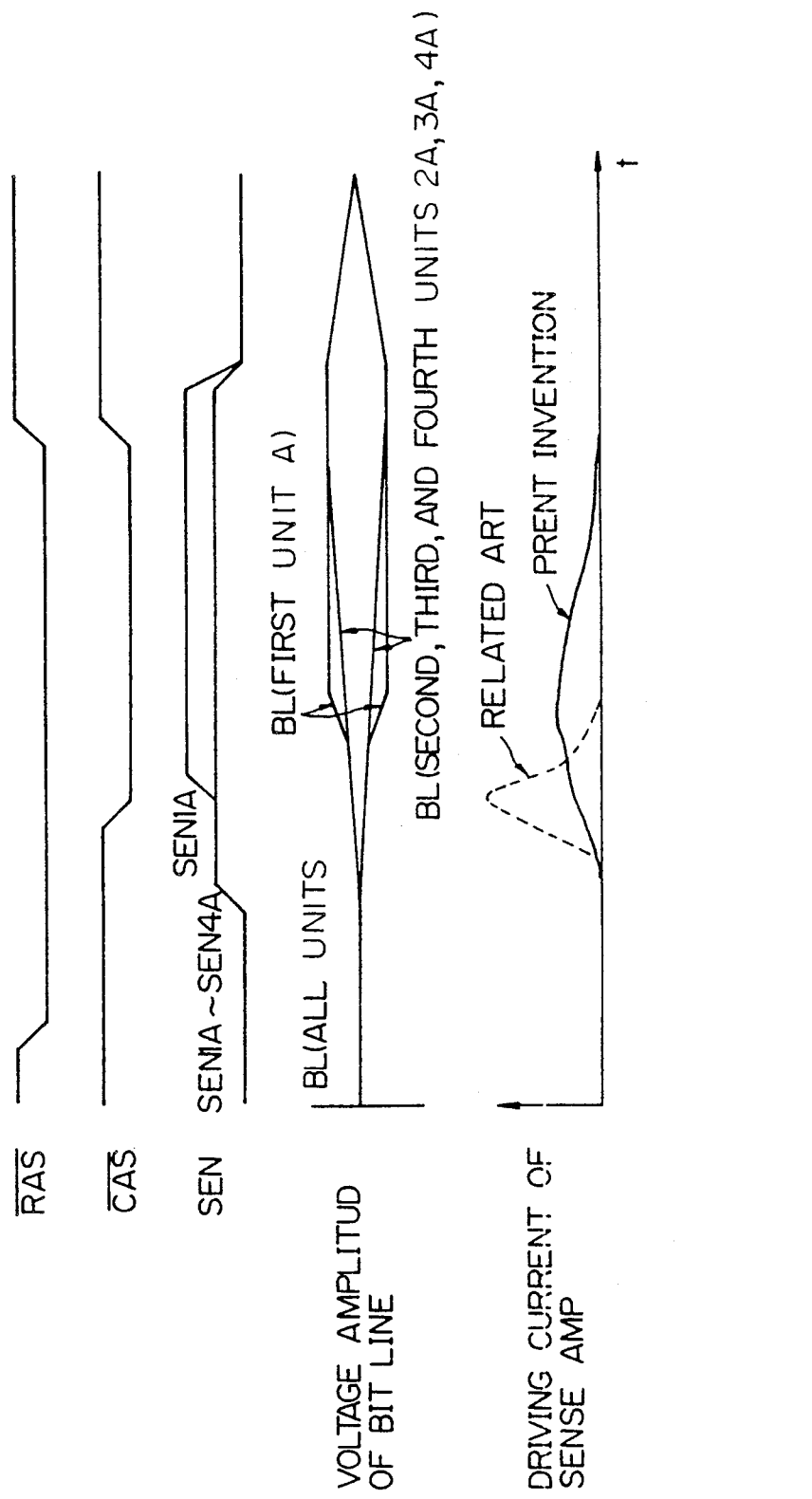

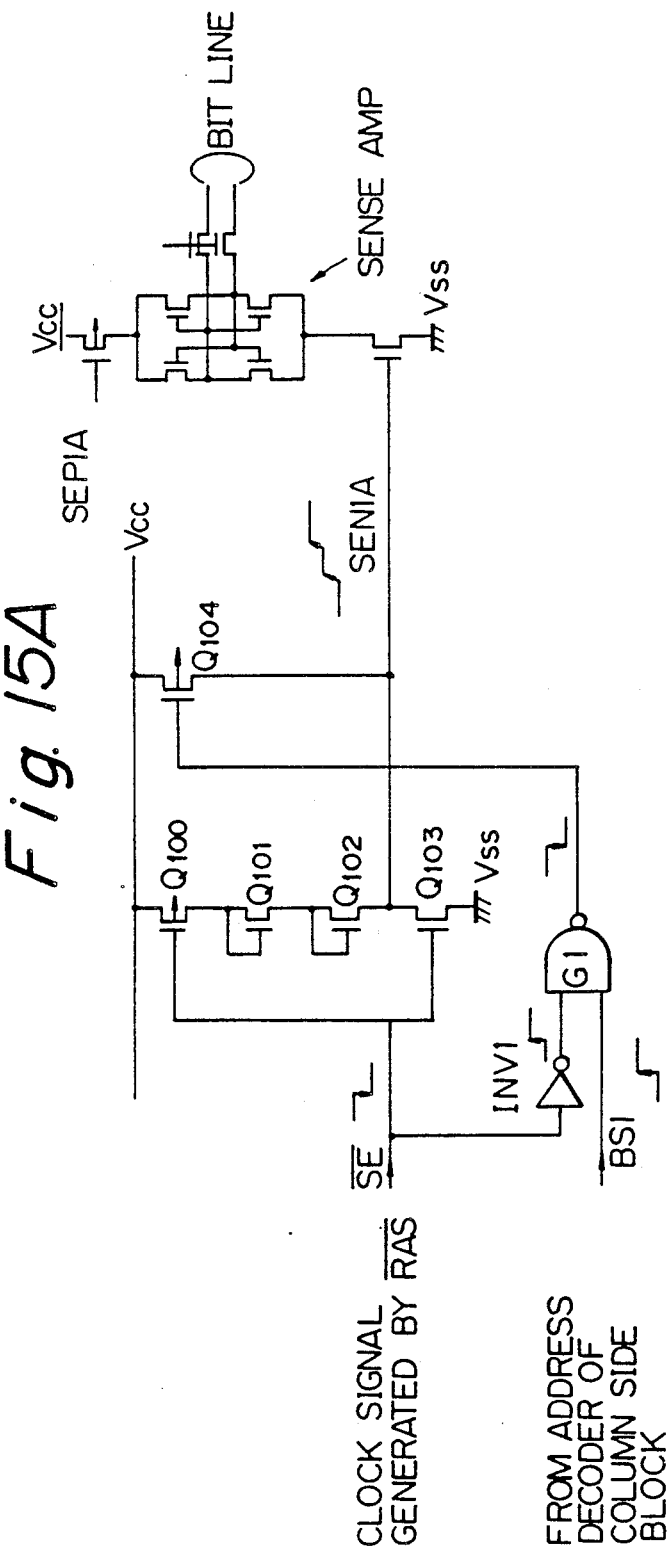
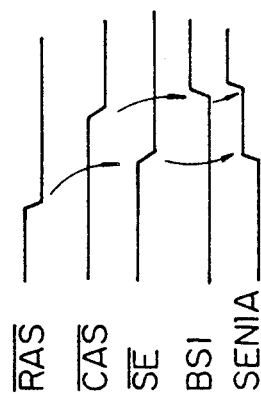
Fig. 15A
Fig. 15B

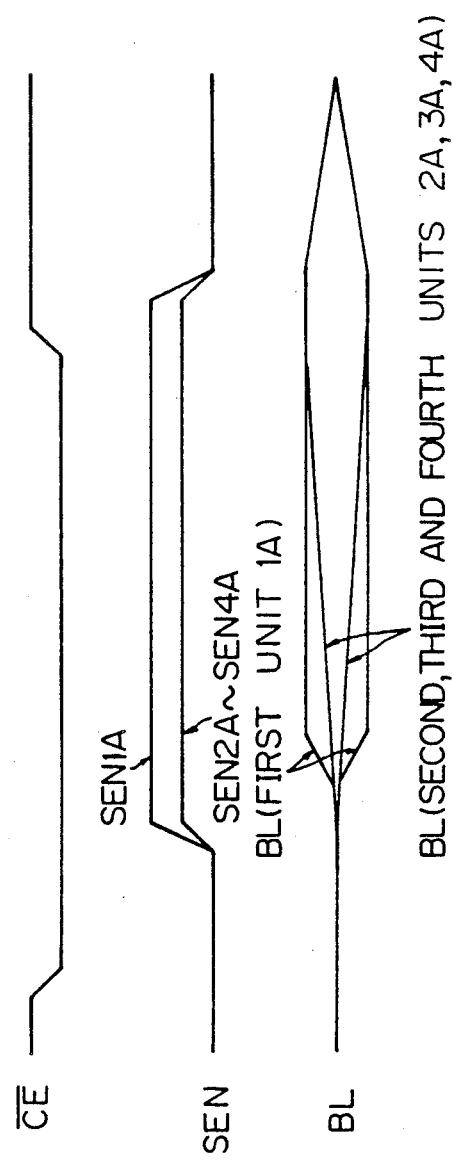

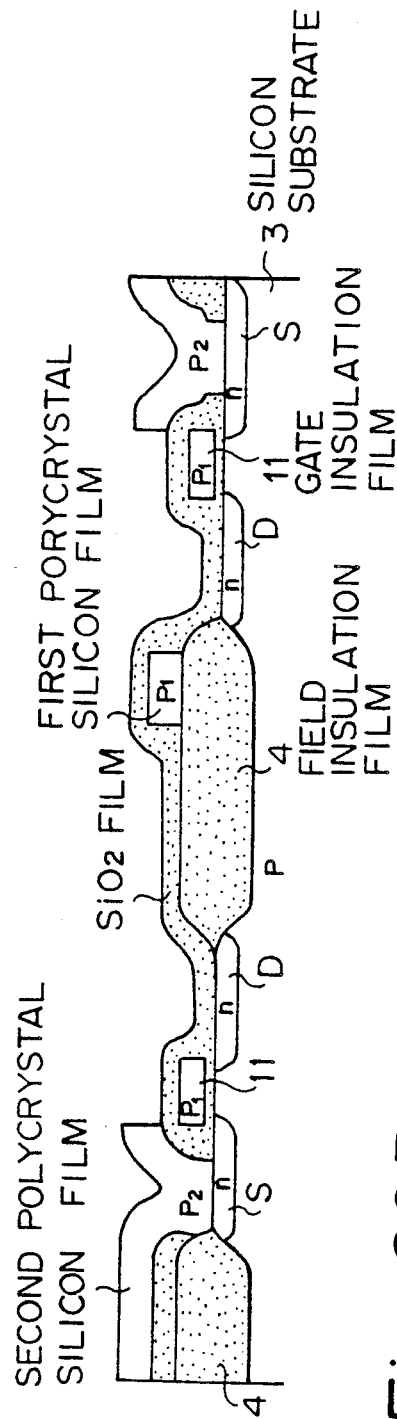
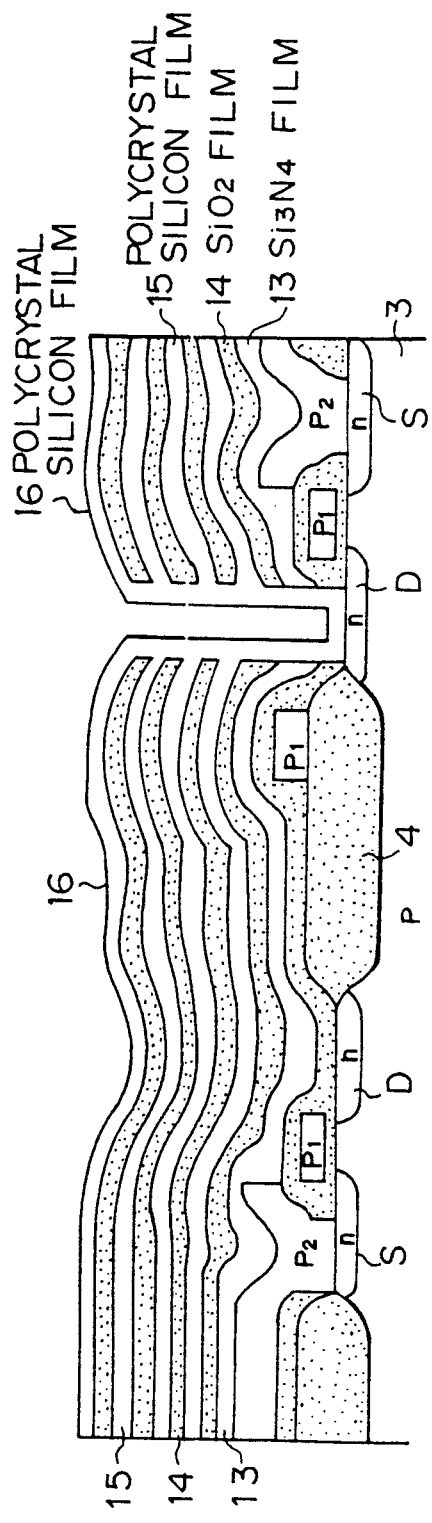

SEMICONDUCTOR MEMORY DEVICE FOR DECREASING OCCUPANCY AREA BY PROVIDING SENSE AMPLIFIER DRIVING LINES OVER SENSE AMPLIFIERS AND MEMORY CELLS

BACKGROUND OF THE INVENTION

1. Field of the Invention

The present invention relates to a semiconductor memory device, more particularly, to a large capacity dynamic random access memory device for decreasing an occupancy area by providing sense amplifier driving lines over sense amplifiers and memory cells.

2. Description of the Related Art

Recently, in a semiconductor memory device, it is required that an area of each portion in the semiconductor memory device be made small in accordance with increasing the capacity of a bit line. It is useful for decreasing the occupancy area of each portion in the semiconductor memory device to minutely form a configuration of the semiconductor memory device, and to provide efficient wirings.

Generally, in a semiconductor memory device, a plurality of lines are required, for example, bit lines, word lines, data buses, sense amplifier driving lines, column select lines, power supply lines, and the like. The bit lines are constituted by polycrystal silicon and a diffusion layer formed on a substrate, and the word lines are constituted by polycrystal silicon accompanied with a gate of the memory cell transistor, and a metal (aluminium) wiring backing the polycrystal silicon to decrease a resistance thereof. For example, the wiring layers are constituted by seven layers, i.e., four polycrystal silicon layers, two aluminium layers, and one diffusion layer. The sense amplifier driving lines and the data buses running in the lengthwise direction (word line direction) and the column select lines running in the lateral direction (bit line direction) are constituted in respective aluminium wiring over the memory portion. Nevertheless, the power supply lines for applying a low and a high voltage to each of the sense amplifier driving lines along the lengthwise direction are not formed over the memory portion but are formed in the circumference of the memory portion along the lateral direction, and data bus lines connected to the data buses and data latch circuit are formed in the circumference of the memory cell portion along the lateral direction. Namely, the areas for the power supply lines and the data bus lines along the lateral direction should be provided in the circumference of the memory cell portion. Furthermore, a plurality of sense amplifiers arranged as a line-shape in the lengthwise direction are connected to the same sense amplifier driving lines in the lengthwise direction, and thus a width of each sense amplifier driving line becomes large. Therefore, the occupancy area of the semiconductor memory device becomes large.

Furthermore, in the conventional semiconductor memory device, when the sense amplifier driving lines are running along the word line direction (sense amp line direction), all sense amplifiers in the sense amp line are driven by the same driving lines. Note, the width of the driving lines close to the power lines should be made large, as the currents flowing in all the sense amplifiers in the sense amp line are flown to the power lines through the driving lines close to the power lines.

Additionally, in recent years, the capacity of DRAM devices become large, and a memory cell of the DRAM is constituted by a solid structure of a three dimensional stacked capacitor cell. This stacked capacitor cell is useful for reducing an occupancy area of the memory cell without decreasing the capacitance thereof. In the circumference of the memory cell portion, a plurality of peripheral circuits, for example, a sense amplifier, a bit line driver, a row decoder, a column decoder, and the like, are provided. Note, these peripheral circuits are constituted by normal semiconductor elements whose height corresponds to a single layer, the memory cell is constituted by the three dimensional stacked capacitor cell whose height corresponds to a plurality of layers, and thus an excessive difference is caused at the border portion between the memory cell portion and the peripheral circuit portion. This level difference between the memory cell portion and the peripheral circuit portion can not be included in a depth of focus of a exposure system. Therefore, the aluminium wirings can not be freely formed over the memory cell portion and peripheral circuit portion in high accuracy, and thus an occupancy area of the DRAM device can not be decreased.

SUMMARY OF THE INVENTION

It is an object of the present invention to provide a semiconductor memory device having a large capacity and a small occupancy area. Furthermore, it is another object of the present invention to provide a semiconductor memory device having a large capacity and a high speed operation. Additionally, it is still another object of the present invention to provide a semiconductor memory device having a small peak current value caused by the operation of a plurality of sense amplifiers.

According to the present invention, there is provided a semiconductor memory device comprising: a plurality of word lines; a plurality of bit lines formed crossing the word lines; a plurality of memory cells, each connected between the one word line and the one bit line; a plurality of sense amplifiers, arranged along the word line direction; a first power supply line; a second power supply line; a plurality of first sense amplifier driving lines, connected to the sense amplifiers and formed in a first wiring layer; and a plurality of second sense amplifier driving lines, each connected between the corresponding first sense amplifier driving line and one of the first and second power supply lines, and formed in a second wiring layer.

The first sense amplifier driving lines may be formed along the word line direction, and the second sense amplifier driving lines may be formed along the bit line direction. The first sense amplifier driving lines may be connected to the first and second power supply line at a plurality of portions through a plurality of the second sense amplifier driving lines.

The sense amplifiers and the memory cells may be divided into a plurality of blocks. Each of the second sense amplifier driving lines may be connected to one of the first and second power supply lines through a gate transistor, so that one of the divided blocks may be selected. The sense amplifiers may be arranged as a sense amplifier line of a line-shape along the word line direction, and the memory cells may be divided into two groups provided for both sides of the sense amplifier line, in each of the blocks.

Each of the blocks may be divided into a plurality of units. Each of the first sense amplifier driving lines may be divided into a plurality of first unit sense amplifier driving lines corresponding to the units, each of the second sense amplifier driving lines may be divided into a plurality of second unit sense amplifier driving lines connected to the corresponding first unit sense amplifier driving lines. Each of the second unit sense amplifier driving lines may be connected to the first and second power supply lines through a gate transistor.

The gate transistors connected to the corresponding second unit sense amplifier driving lines in the same divided block may be controlled by the same control signal, so that one of the divided blocks may be selected and the units in the selected block are selected at the same timing. The gate transistors connected to the corresponding second unit sense amplifier driving lines in the same divided block may be controlled by one read out signal and the other refresh signals, so that one unit including a memory cell for reading out in a selected block may be read out at high speed and the other units in the selected block are only refreshed at different timing than the read out operation. A voltage value of the read out signal may be higher than that of the refresh signal, so that the read-out operation unit may be speedily driven and the refresh operation unit may be slowly driven.

The semiconductor memory device may further comprise data bus lines and a data latch circuit, the data bus lines may be connected between the sense amplifiers and the data latch circuit. The data bus lines may comprise first data bus lines connected to the sense amplifiers and formed in the first wiring layer along the word line direction, and second data bus lines connected between the corresponding first bus lines and the data latch circuit and formed in the second wiring layer along the bit line direction. The second data bus lines may be connected to a plurality of the first data bus lines and the data latch circuit through gate transistors, the gate transistors may be controlled by a selector, so that one of the first data bus lines may be selected and connected to the data latch circuit. The first data bus lines may be divided into a plurality of group bus lines, the second data bus lines and the data latch circuit may be provided in accordance with the divided group bus lines, and the second data bus lines may be connected to the corresponding group bus lines and the data latch circuit through a switching circuit, so that each one of the group bus lines may be selected and connected to the each data latch circuit.

The semiconductor memory device may comprise further signal lines formed in the first wiring layer and the second wiring layer. The second sense amplifier driving lines may be formed between a memory cell portion and a peripheral circuit portion, and the second sense amplifier driving lines may be connected to the one of the first and second power supply lines through a connection conductor. Each of the memory cell may comprise a stacked capacitor and a memory cell transistor. The first wiring layer and the second wiring layer provided above the memory cells and the sense amplifiers may be used to form data bus lines, sense amplifier driving lines, the other signal lines, and power supply lines.

Furthermore, according to the present invention, there is also provided a semiconductor memory device comprising: a plurality of word lines; a plurality of bit lines formed crossing the word lines; a plurality of memory cells, each connected between the one word line and the one bit line; a plurality of sense amplifiers, each connected to a pair of the bit lines; a first power supply line; a second power supply line; and a pair of sense amplifier driving layers, connected between the first and second power supply lines and each of the sense amplifiers, and formed in a wiring layer over the memory cells and the sense amplifiers.

BRIEF DESCRIPTION OF THE DRAWINGS

The present invention will be more clearly understood from the description of the preferred embodiments as set forth below with reference to the accompanying drawings, wherein:

FIG. 14 is a diagram indicating a timing chart for explaining an operation of a preferable sense amplifier for the semiconductor memory device shown in FIG. 13;

FIG. 15A is a circuit diagram indicating an example of a driving signal generation circuit for a sense amplifier;

FIG. 15B is a diagram indicating a timing chart explaining an operation of the driving signal generation circuit shown in FIG. 15A;

FIG. 17 is a diagram indicating a timing chart for explaining an operation of a semiconductor memory device of a Pseudo Static type;

FIG. 20A to 20G are sectional diagrams for explaining a method of forming the aluminium wiring between the memory cell element and the peripheral circuit element shown in FIG. 19.

DESCRIPTION OF THE PREFERRED EMBODIMENTS

First, a semiconductor memory device according to a related art will be explained, with reference to FIGS. 1 and 2.

In a semiconductor memory device, a plurality of word lines, bit lines, data bus lines, sense amplifier driving lines, column select lines and power supply lines, and the like are formed and used. The number of these lines becomes large in accordance with an increase in capacity, and these lines cannot be formed in a single wiring layer. Therefore, in recent years, the conduction lines are formed in a plurality of wiring layers as a multilayer device.

Figure 1B:
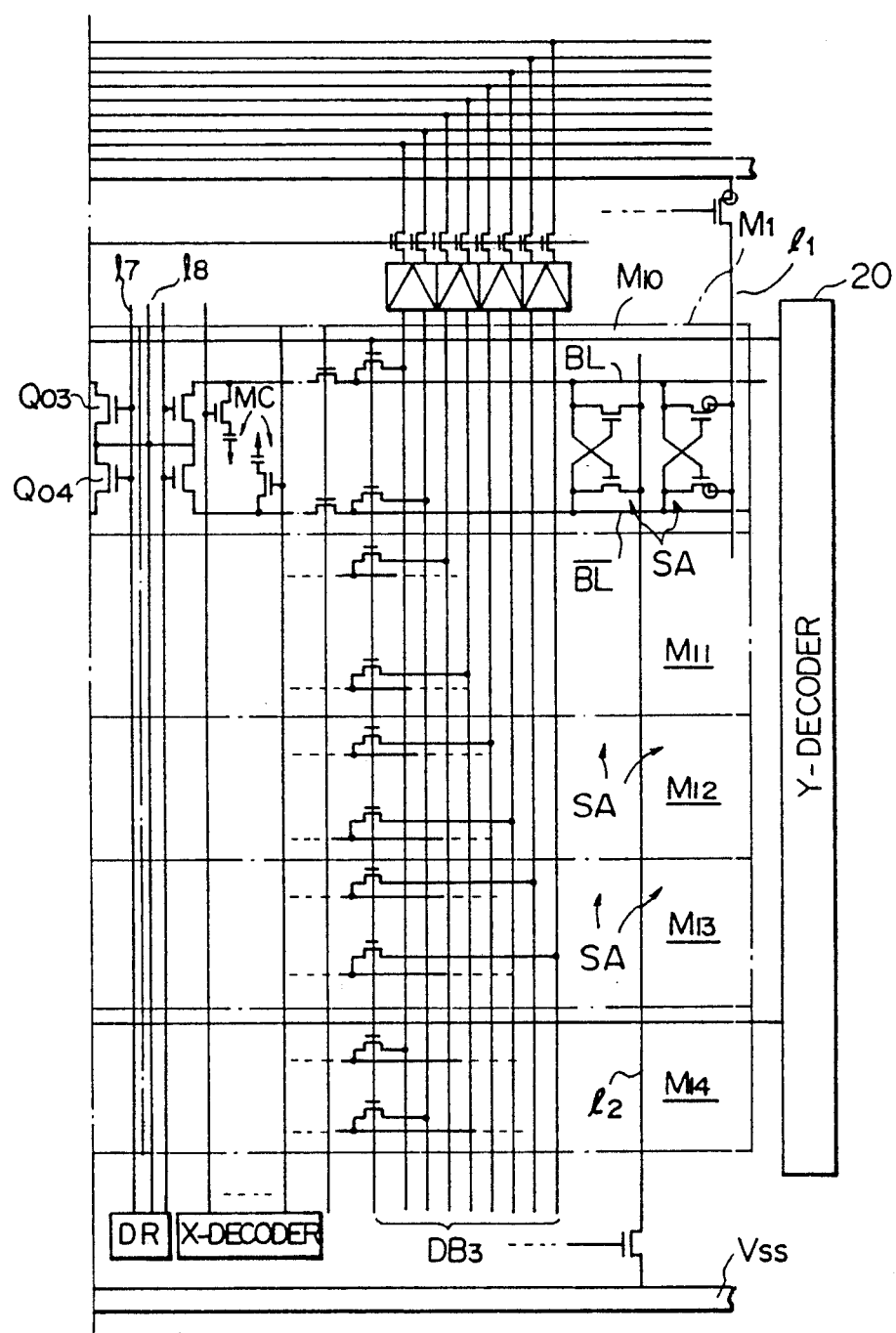
FIG. 1 made up of FIGS. 1A and 1B is a circuit diagram for explaining an example of a semiconductor memory device in a related art.

FIG. 1 is a circuit diagram for explaining an example of a semiconductor memory device in a related art. Note, the circuit diagram shown in FIG. 1 corresponds to a wiring layout on the semiconductor memory device (chip). In FIG. 1, reference WL running in a lengthwise direction denotes a word line, references BL and $\overline{BL}$ running in a lateral direction denote bit lines, and these word line WL and bit lines BL and $\overline{BL}$ are plurality provided in the semiconductor memory device. A memory cell MC is provided at an intersection between each of the word lines WL and each of the bit lines BL and $\overline{BL}$. Note, in FIG. 1, only units $M_{00}$ and $M_{11}$ are described in detail, and the units $M_{00}$, $M_{01}$, $M_{02}$, ..., $M_{10}$, $M_{11}$, $M_{12}$, ... have the same configuration.

As shown in FIG. 1, the sense amplifiers SA are arranged as a sense amp line in the lengthwise direction, or along the word line direction (WL), and data buses $DB_2$ and $DB_3$ are formed in parallel to the sense amp line, or along the word line direction (WL). In the unit $M_{00}$, the bit lines BL and $\overline{BL}$ are connected to the corresponding bus lines in the data bus $DB_2$ through column gate transistors $G_2$ and $G_3$. Similarly, in the unit $M_{10}$ the bit lines BL and $\overline{BL}$ are connected to the corresponding bus lines in the data bus $DB_3$ through column gate transistors. Note, the semiconductor memory device shown in FIG. 1 is a DRAM device of a four-bit simultaneous read out type, and the bit lines BL and $\overline{BL}$ in the units $M_{00}$, $M_{01}$, $M_{02}$, $M_{03}$ are connected to eight bus lines of the data bus $DB_2$ through column gate transistors. Data read out to the data bus $DB_2$ are latched by data latch circuits DL, and read out externally through gate transistors $G_1$ and data bus $DB_1$ running in the bit line direction (lateral direction).

In FIG. 1, lines $l_1$ and $l_2$ are sense amplifier driving lines, the sense amplifier driving line $l_1$ is connected to a high potential power supply line Vcc through a gate transistor $G_{10}$ of a p-type MOS transistor, the driving line $l_2$ is connected to a low potential power supply line Vss through a gate transistor $G_{11}$, of an n-type MOS transistor, and an operation of the sense amplifiers SA is controlled by the gate transistors $G_{10}$ and $G_{11}$. Note, gate transistors $G_4$, $G_5$ and $G_6$, $G_7$ are used as cut gates, transistors $Q_{01}$, $Q_{02}$ and $Q_{03}$, $Q_{04}$ are used as reset (short-circuit) transistors, lines $l_5$ and $l_7$ are ON/OFF control signal lines of the transistors $Q_{01}$, $Q_{02}$ and $Q_{03}$, $Q_{04}$, and lines $l_6$ and $l_8$ are power supply lines for a short-circuit between the bit lines BL and $\overline{BL}$. The configuration of the other blocks and units are as same as the blocks $M_0$, $M_1$ and the units $M_{00}$, $M_{10}$. An X-decoder 10 selects a word line WL, a Y-decoder 20 selects bit lines. Note, in this example, the Y-decoder 20 selects four pairs of bit lines, and reference DR denotes a gate driver circuit.

The memory cells are provided for both sides of right and left of the sense amp line, when selecting the left side memory cells, the right side memory cells are cut off by the cut gate transistors $G_6$ and $G_7$. Conversely, when selecting the right side memory cells, the left side memory cells are cut off by the cut gate transistors $G_4$ and $G_5$.

Generally, the bit lines are constituted by polycrystal silicon and a diffusion layer formed on a substrate. The word lines are constituted by polycrystal silicon accompanied with a gate of the memory cell transistor, and a metal (aluminium) wiring backing the polycrystal silicon to decrease a resistance thereof. In the case that a memory cell is a stacked type, the memory cell is constituted by two layers of polycrystal silicon. Note, in this example, the wiring layers are constituted by seven layers, i.e., four polycrystal silicon layers, two aluminium layers, and one diffusion layer. The data buses $DB_2$ and $DB_3$ running in the lengthwise direction (along the word line direction) and the column select lines $l_3$ and $l_4$ are constituted by a first layer and a second layer of the two aluminium wirings, respectively. The column select lines $l_3$ and $l_4$ and the like are commonly used in both blocks $M_{00}$ and $M_{10}$ to decrease the occupancy area of the semiconductor memory device.

Figure 6:
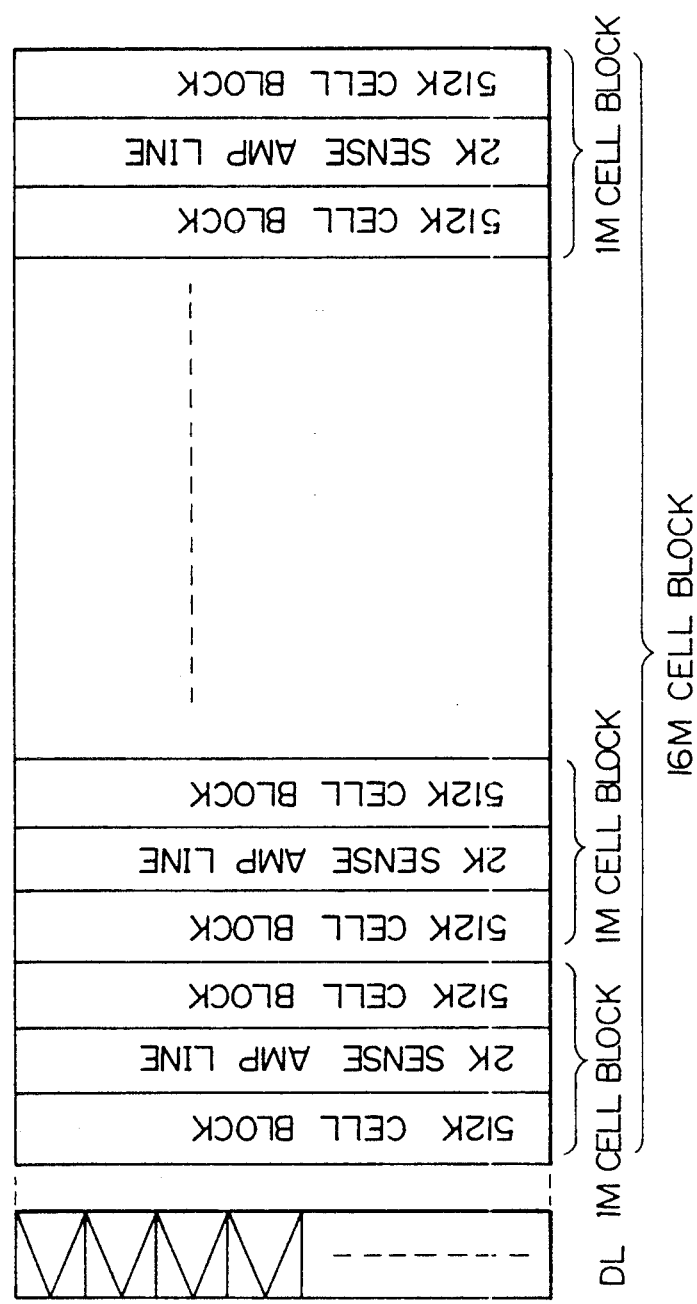
FIG. 6 is a block diagram indicating a layout of memory cell blocks and sense amplifier lines of a DRAM device.

Nevertheless, in the semiconductor memory device shown in FIG. 1, each data bus $DB_2$ and $DB_3$ is constituted by eight bus lines (four pairs of bus lines), when assuming a pitch of the bus line to be 3 μm, the required width of the each data bus $DB_2$ and $DB_3$ becomes 24 μm (4 pairs ×2×3 μm=24 μm). In the case that the semiconductor memory device is a large capacity (for example, 16 M-bit) DRAM, as shown in FIG. 6, sixteen cell blocks each having a capacity of 1M-bit are provided in parallel. Note, each cell block comprises 2K (2048) sense amplifiers (sense amp line) and 512K cell blocks provided for both sides of the sense amp line. Therefore, in a 16M-bit capacity DRAM, an occupancy area of the total data buses becomes 384 μm (16 groups ×24 μm=384 μm), so that the occupancy area becomes large. Note, a required width of the data bus $DB_1$, which is formed close to the memory cell portion, corresponds to the width of each data bus $DB_2$ and $DB_3$, so that the area for the data bus $DB_1$ becomes large.

Figure 2A:
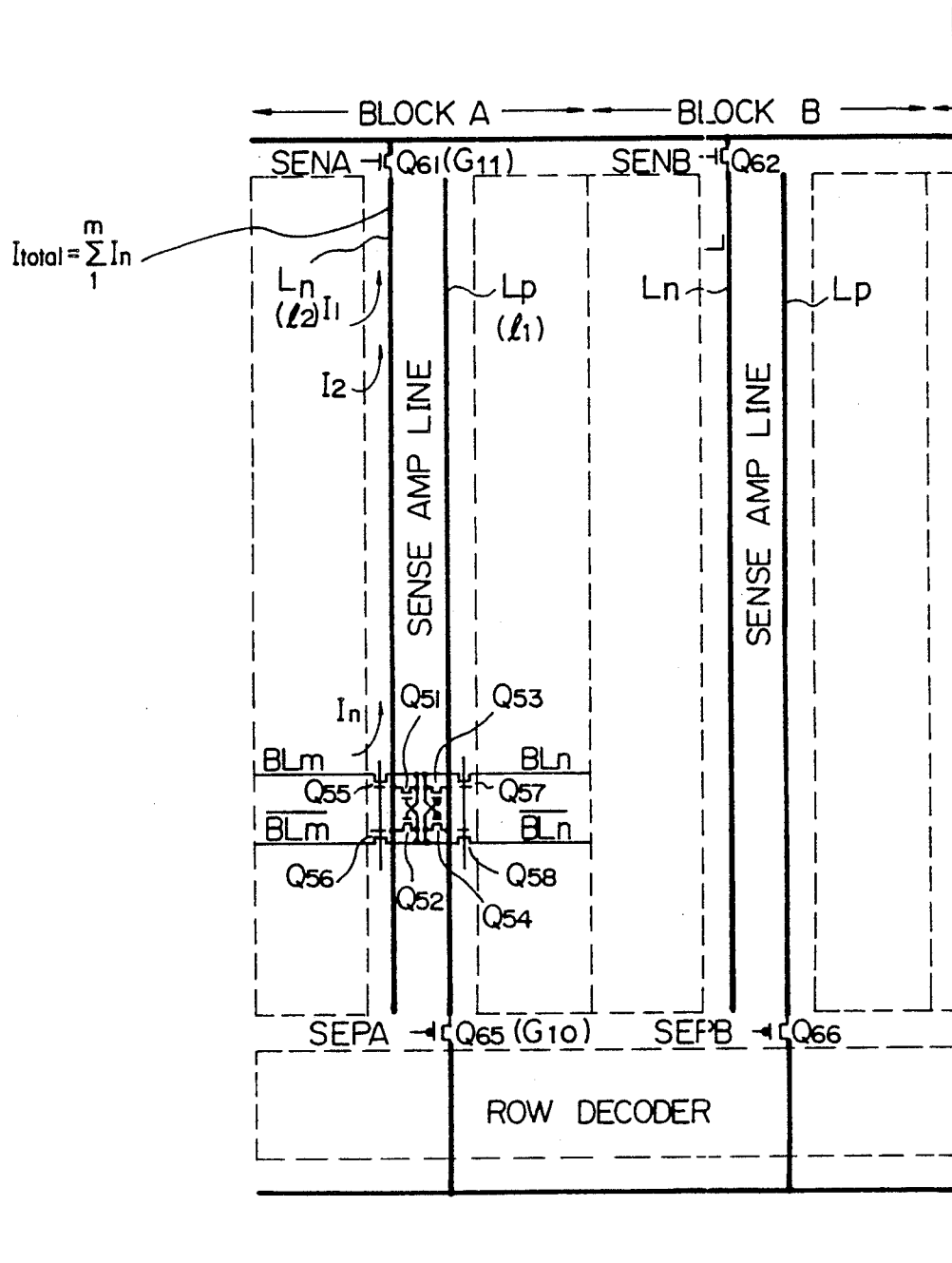
FIG. 2 made up of FIGS. 2A and 2B is a block diagram for explaining problems of the semiconductor memory device in the related art.
Figure 2B:
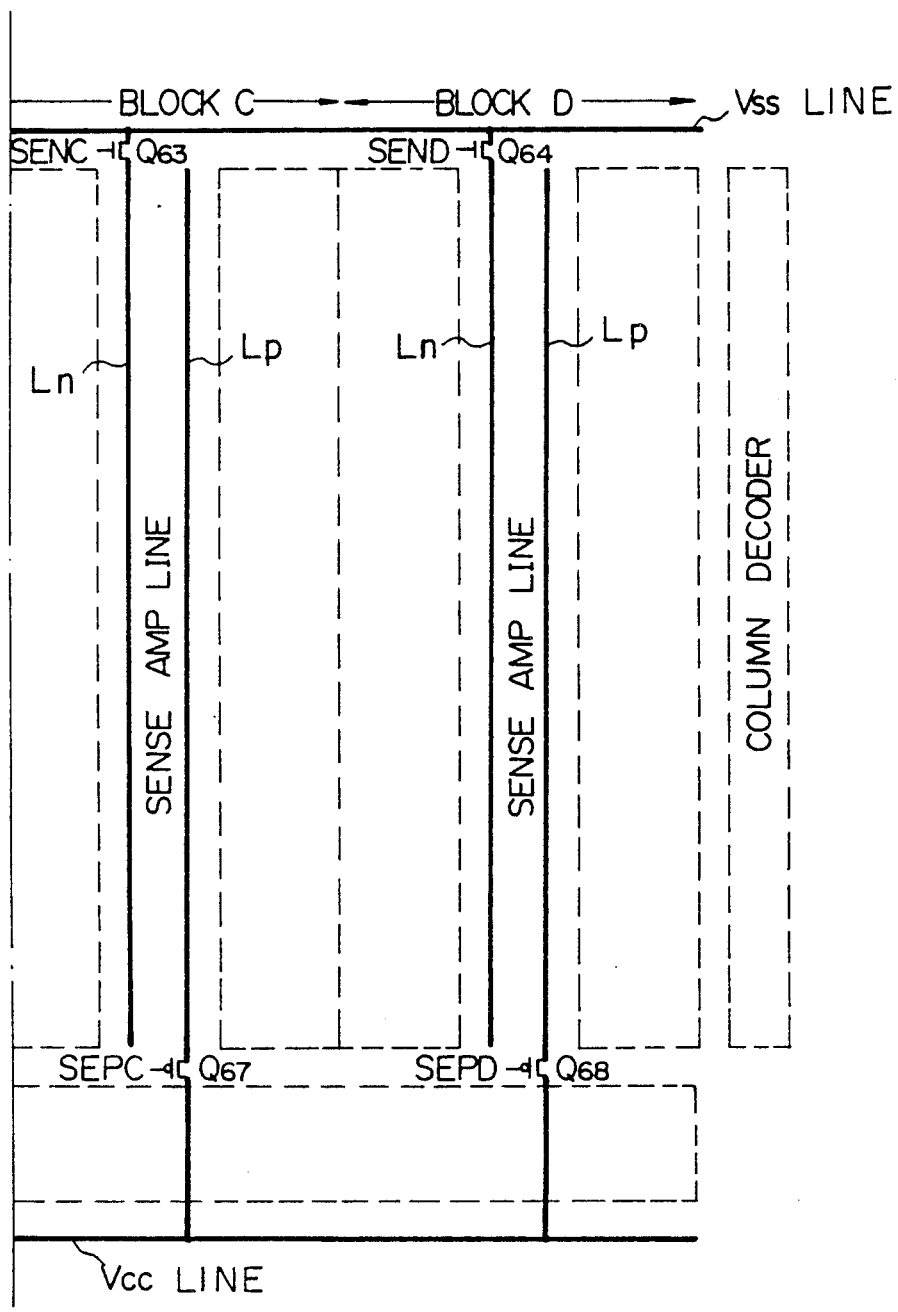

FIG. 2 is a block diagram for explaining problems of the semiconductor memory device in the related art. Note, the block diagram shown in FIG. 2 corresponds to a wiring layout on the semiconductor memory device (chip). As shown in FIGS. 1 and 2, in the sense amp line, each sense amplifier SA is supplied with the power supplies Vss and Vcc through the gate transistors and the pair of sense amplifier driving lines Ln ($l_2$) and Lp ($l_1$) which are running along the word line direction (the lengthwise direction). Note, each sense amplifier driving lines drive 2K (2048) sense amplifiers, a current flowing in each of the driving lines Ln ($l_2$) and Lp ($l_1$) becomes large, and thus a width of the driving line Ln ($l_2$) and Lp ($l_1$) should be determined to about 40 μm. Namely, when assuming the number of sense amplifiers to be m, and the current flowing in each sense amplifier to be In, then the total current $I_{total}$ flowing in the sense amplifier driving line (Ln), especially at the driving line Ln close to the gate transistor $Q_{61}$, becomes a value of (In × m).

In recent years, the occupancy area of the sense amp line (sense amplifiers) is not a result of the transistor size in the sense amplifiers, but of the width of the sense amplifier driving lines Ln ($l_2$) and Lp ($l_1$) provided over the sense amp line. For example, in a 16M-bit DRAM device, an occupancy area of the total sense amplifier driving lines becomes about 1280 μm (16 groups × 2 × 40 μm = 1280 μm), so that the occupancy area of the DRAM device becomes large. Additionally, as shown in FIGS. 1 and 2, the power supply lines connected to the sense amplifier driving lines Ln ($l_2$) and Lp ($l_1$) are provided close to the memory portion along the word line direction. Namely, the high potential power supply line Vcc and the low potential power supply line Vss should be provided at the upper (lower) side and the lower (upper) side of the memory portion in order to apply the low and high potentials to the sense amplifiers through the sense amplifier driving lines Ln ($l_2$) and Lp ($l_1$). The width of the power supply lines Vcc and Vss are also large, and thus the occupancy area of the DRAM device becomes large.

It is an object of the present invention to provide a semiconductor memory device having a large capacity and a small occupancy area.

Below, the preferred embodiments of a semiconductor memory device according to the present invention will be explained with reference to the drawings.

Figure 3:
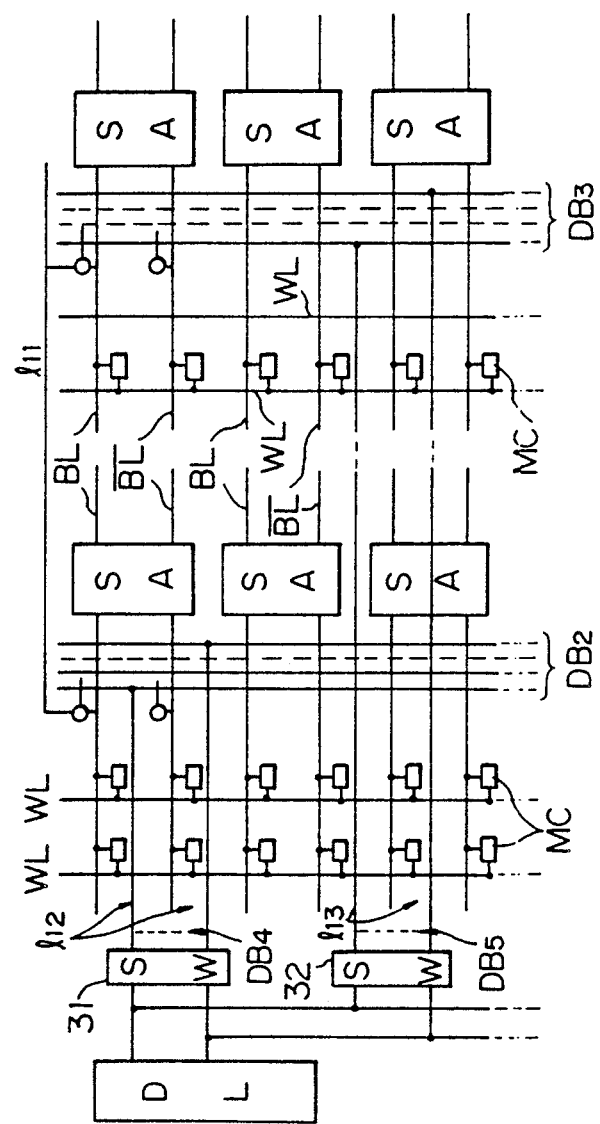
FIG. 3 is a basic diagram indicating a first embodiment of a semiconductor memory device according to the present invention.

FIG. 3 is a basic diagram indicating a first embodiment of a semiconductor memory device according to the present invention. Note, the block diagrams and the circuit diagrams shown in FIGS. 3 to 5, 7 to 10, 12 and 13 correspond to wiring layouts on the semiconductor memory device (chip).

As shown in FIG. 3, the semiconductor memory device of the first embodiment comprises a plurality of word lines WL, a plurality of bit lines BL and $\overline{BL}$, a plurality of sense amplifiers SA, and data buses $DB_2$ and $DB_3$. The data buses $DB_2$ and $DB_3$ are provided along the word line direction (lengthwise direction) for outputting a potential of the bit lines BL and $\overline{BL}$ amplified by the sense amplifiers SA to an external destination. Note, the data buses $DB_2$ and $DB_3$ are connected to a data latch circuit DL through data bus lines $l_{12}$ and $l_{13}$ running along the bit line direction and switching circuit SW (gate transistors 31, 32). The data bus lines $l_{12}$ and $l_{13}$ are provided above memory cells MC and the sense amplifiers SA crossing the data buses $DB_2$ and $DB_3$ in a wiring layer. Consequently, the data bus $DB_1$ shown in FIG. 1 can be deleted, and thus an occupancy area of the semiconductor memory device can be decreased. Furthermore, one data latch circuit DL can be used for receiving data through both data buses $DB_2$ and $DB_3$ by controlling the switching circuit SW.

Figure 4A:
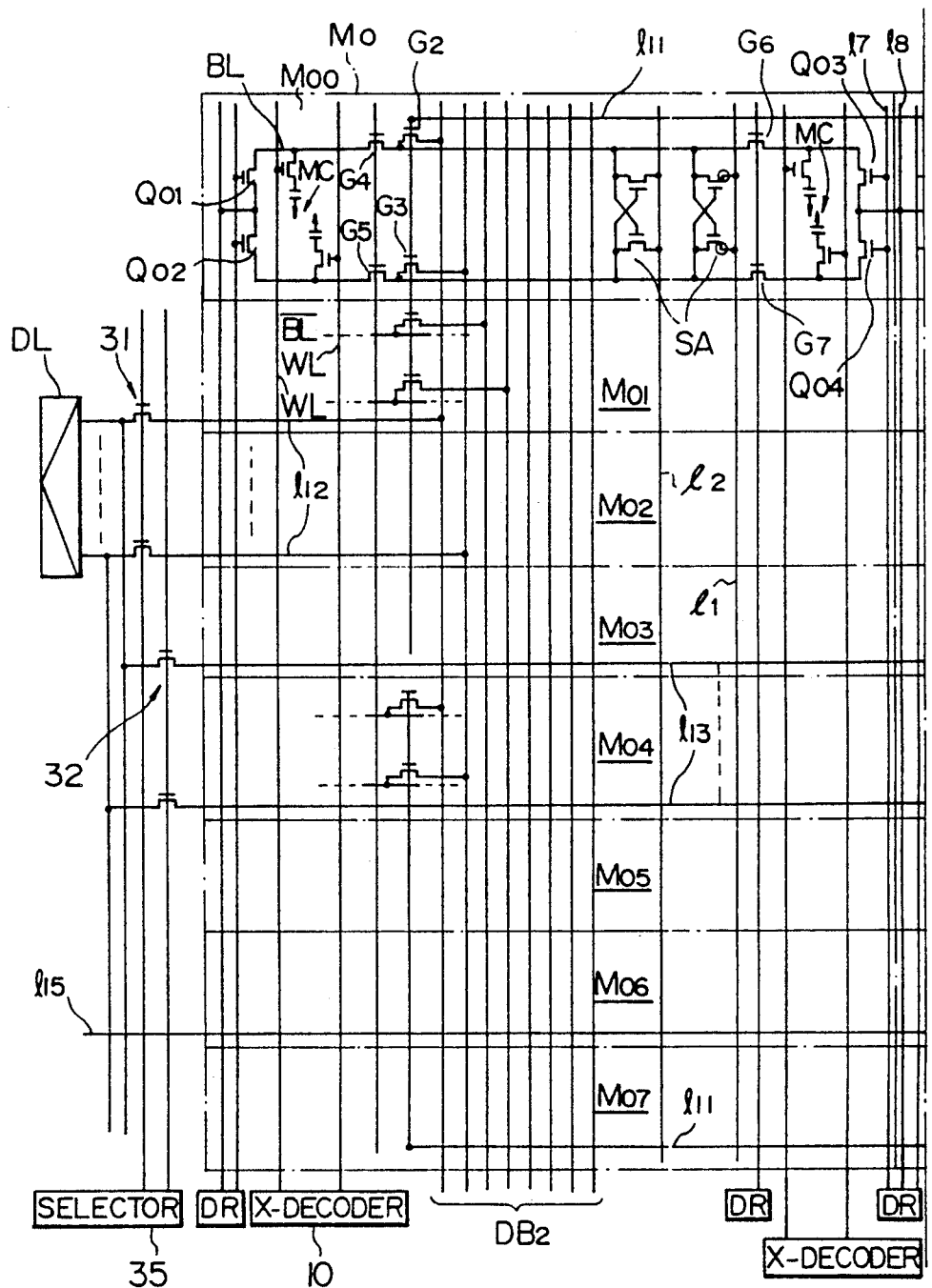
FIG. 4 made up of FIGS. 4A and 4B is a circuit diagram indicating the first embodiment of the semiconductor memory device according to the present invention.
Figure 4B:
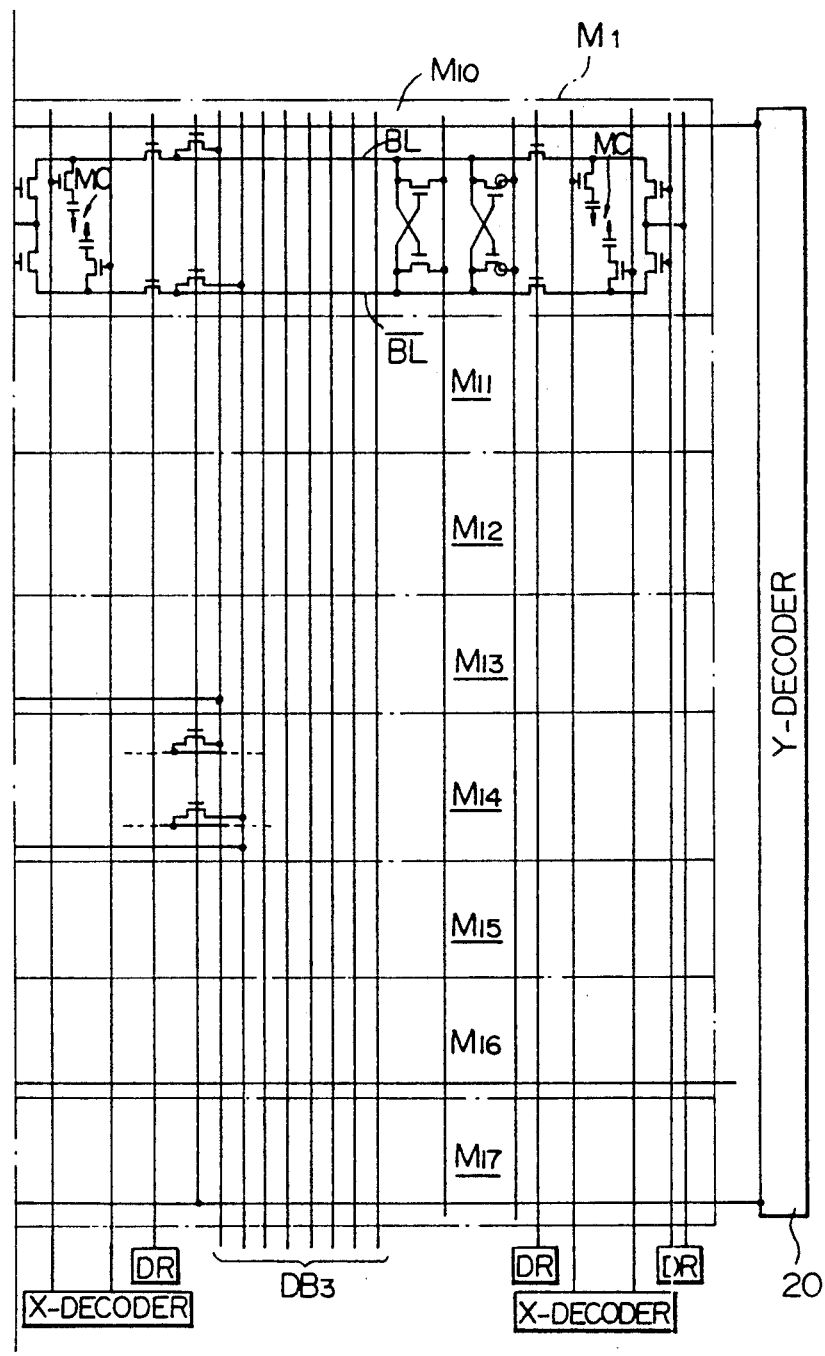

FIG. 4 is a circuit diagram indicating the first embodiment of the semiconductor memory device according to the present invention. As shown in FIG. 4, a configuration of the semiconductor memory device of the first embodiment is similar to the semiconductor memory device shown in FIG. 1. The same references in FIGS. 1 and 2 indicate the same portion in all drawings.

Namely, in FIG. 4, reference WL denotes a word line, references BL and $\overline{BL}$ denote bit lines, reference MC denotes memory cell, and reference SA denotes a sense amplifier. Note, in FIG. 4, a pair of bit lines BL and $\overline{BL}$, memory cells MC connected to the bit lines BL and $\overline{BL}$ and a sense amplifier SA are included in each unit (block) $M_{00}, M_{01}, M_{02}, \ldots$, and $M_{10}, M_{11}, M_{12}, \ldots$, and block $M_0$ and $M_1$ are formed by a plurality of units $M_{00}, M_{01}, M_{02}, \ldots$ and $M_{10}, M_{11}, M_{12}, \ldots$ which are arranged in the lengthwise direction (word line direction).

In FIG. 4, the sense amplifiers SA are arranged as a sense amp line in the word line direction, and data buses $DB_2$ and $DB_3$ are formed in parallel to the sense amp line. In the unit $M_{00}$, the bit lines BL and $\overline{BL}$ are connected to the corresponding bus lines in the data bus $DB_2$ through column gate transistors $G_2$ and $G_3$. Similarly, in the unit $M_{10}$ the bit lines BL and $\overline{BL}$ are connected to the corresponding bus lines in the data bus $DB_3$ through column gate transistors. Note, this semiconductor memory device is a DRAM device wherein four-bit data are simultaneously read out, and the bit lines BL and $\overline{BL}$ in the units $M_{00}, M_{01}, M_{02}, M_{03}$ are connected to eight bus lines of the data bus $DB_2$ through column gate transistors. Data read out to the data bus $DB_2$ are latched by data latch circuits DL through the data bus lines $l_{12}$ and gate transistors 31, similarly, data read out to the data bus $DB_3$ are latched by the data latch circuits DL through the data bus lines $l_{13}$ and gate transistors 32, and read out externally through the data latch circuits DL.

The memory cells are provided for both right and left sides of the sense amp line, when selecting the left side memory cells, the right side memory cells are cut off by the cut gate transistors $G_6$ and $G_7$. Conversely, when selecting the right side memory cells, the left side memory cells are cut off by the cut gate transistors $G_4$ and $G_5$.

In FIG. 4, data bus lines $l_{12}$ and $l_{13}$ are provided at a wiring layer in the lateral direction, or the bit line direction. Namely, the bus lines $l_{12}$, which are eight lines corresponding to eight bus lines of the data bus $DB_2$, are connected between a data latch circuit DL and the bus lines of the data bus $DB_2$ running along the left sense amplifier arrangement. Similarly, the bus lines $l_{13}$, which are also eight lines corresponding to eight bus lines of the data bus $DB_3$, are connected between the data latch circuit DL and the bus lines of the data bus $DB_3$ running along the right sense amplifier arrangement. Note, the bus lines $l_{12}$ and the bus lines $l_{13}$ are commonly connected to the same data latch circuit DL through select gate transistors 31 and 32 which are controlled by a selector circuit 35, and both select gate transistors 31 and 32 are not switched ON at the same time. Therefore, the same data latch circuit DL can be used for both bus lines $l_{12}$ and $l_{13}$. The data read out to the data latch circuit DL are output externally through a specific path (which is not shown in the drawings).

A wiring $l_{15}$ running in the lateral direction is used for another signal line, and a wiring $l_{11}$ running in the lateral direction is used for a column select line connected to the Y-decoder 20 which corresponds to the signal lines $l_3$ and $l_4$ shown in FIG. 1.

Figure 5A:
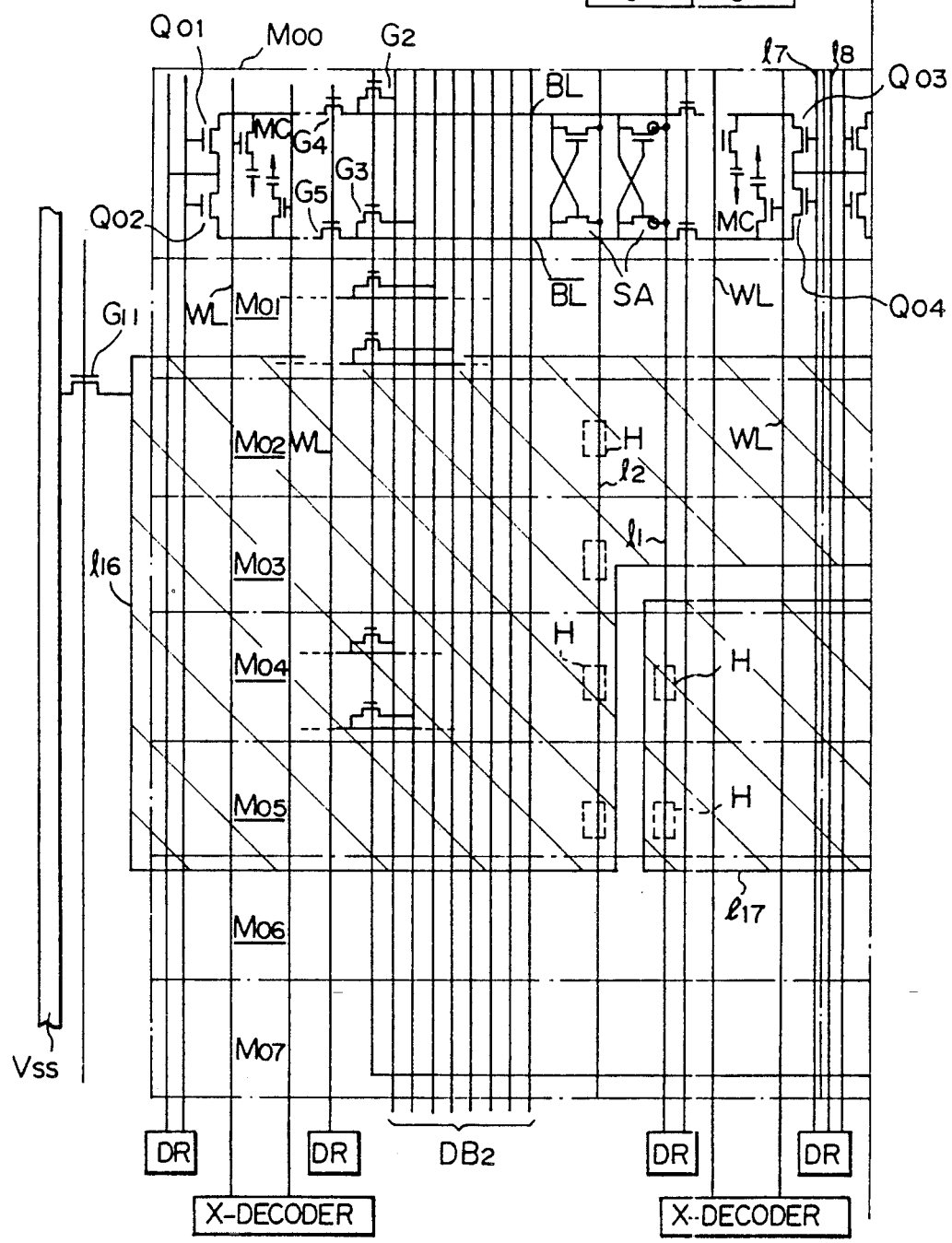
FIG. 5 made up of FIGS. 5A and 5B is a circuit diagram indicating a modification of the first embodiment of the semiconductor memory device according to the present invention.
Figure 5B:
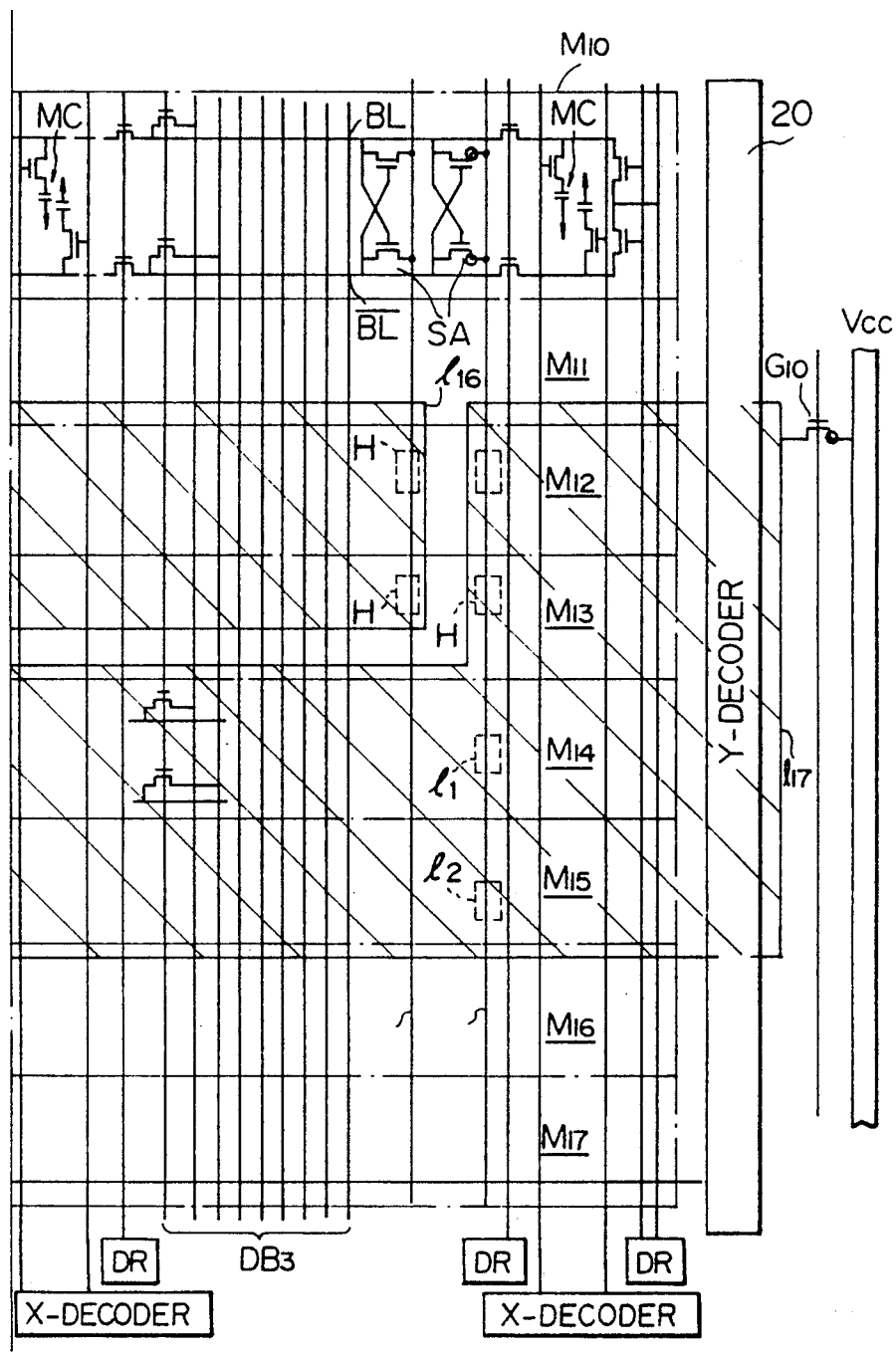

FIG. 5 is a circuit diagram indicating a modification of the first embodiment of the semiconductor memory device according to the present invention. In FIG. 5, sense amplifier driving lines are provided at the wiring layer of the lateral direction as broad width wiring layers $l_{16}$ and $l_{17}$. Note, the wiring layer $l_{16}$ is connected to the low potential power supply line Vss through a gate transistor $G_{11}$ and to the sense amplifier driving line $l_2$ of the sense amplifier SA through a plurality of through-holes H. Similarly, the wiring layer $l_{17}$ is connected to the high potential power supply line Vcc through a gate transistor $G_{10}$ and to the sense amplifier driving line $l_1$ of the sense amplifier SA through a plurality of through-holes H. In this modification of the first embodiment, the wiring layers $l_{16}$ and $l_{17}$ are formed with a broad width and connected to the sense amplifier driving lines $l_2$ and $l_1$ of both right and left sense amplifiers by the same wiring layers $l_{16}$ and $l_{17}$. However, the wiring layers $l_{16}$ and $l_{17}$ can be formed as a plurality of wirings and connected to corresponding driving lines of each of the sense amplifier driving lines $l_2$ and $l_1$, respectively.

As described above, in accordance with the modification of the first embodiment of the present invention, the power supply lines Vcc and Vss (wiring layers $l_{16}$ and $l_{17}$) are provided over the memory cell area and the sense amplifier area (memory cell portion), and thus the power supply lines Vcc and Vss whose width are merely wide can be deleted from the neighboring area of the memory cell portion. Consequently, the occupancy area of the semiconductor memory device can be small.

FIG. 6 is a block diagram indicating a layout of memory cell blocks and sense amp lines of a DRAM device. In FIG. 3, the sense amp lines are only described as two lines, but in a large capacity memory device such as a 16M-bit DRAM device, the sense amp lines become plural. As shown in FIG. 6, in the 16M-bit DRAM device, sixteen cell blocks each having 1M-bit capacity are arranged in parallel. Note, each cell block comprises 2K (2048) sense amplifiers (sense amp line) and two 512K cell blocks are provided on both sides of the sense amp line. In this case, the data latch circuit DL can be commonly used for the sense amp lines which are not operated at the same time by using selector 35 and the select gate transistors 31, 32 shown in FIG. 4. Note, sense amplifier driving lines $l_{12}$, $l_{13}$, and the other lines, which are running in the lateral direction and crossing the sense amp lines, extend to specific portions acrossing these cell blocks.

Figure 7:
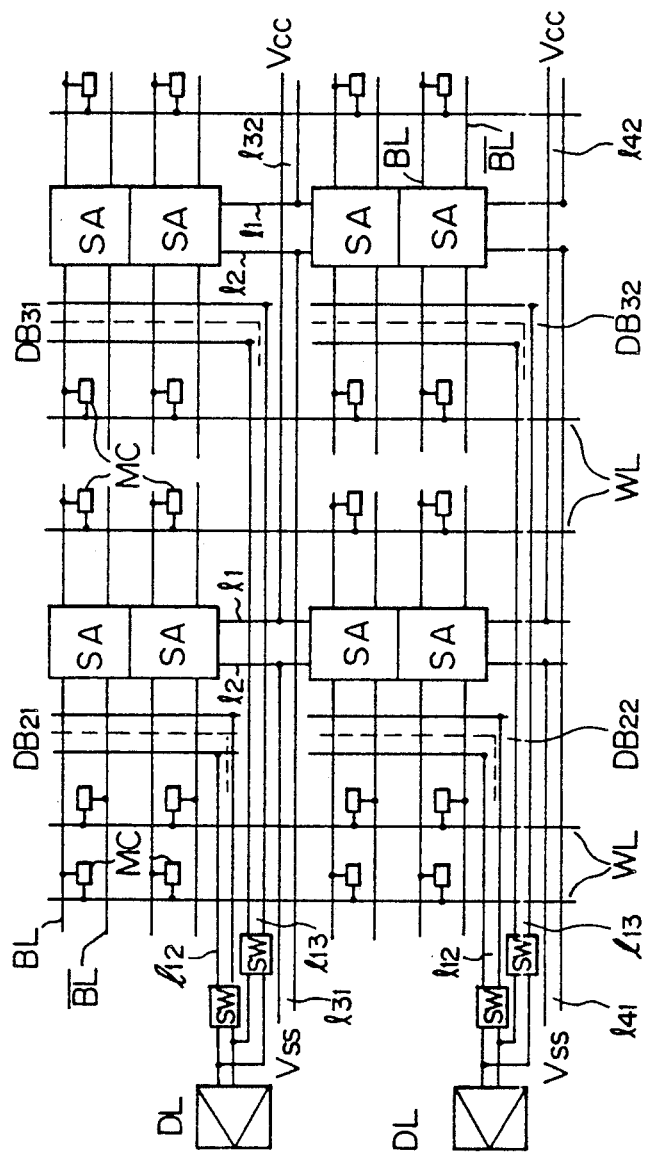
FIG. 7 is a basic diagram indicating a second embodiment of a semiconductor memory device according to the present invention.

FIG. 7 is a basic diagram indicating a second embodiment of a semiconductor memory device according to the present invention.

As shown in FIG. 7, the semiconductor memory device of the first embodiment comprises a plurality of word lines WL, a plurality of bit lines BL and $\overline{BL}$, a plurality of sense amplifiers SA, and data buses $DB_{21}$, $DB_{22}$ and $DB_{31}$, $DB_{32}$. The data buses $DB_{21}$, $DB_{22}$ and $DB_{31}$, $DB_{32}$ are provided along the word line direction (lengthwise direction) for outputting a potential of the bit lines BL and $\overline{BL}$ amplified by the sense amplifiers SA to an external destination. Note, the data buses are divided into a plurality of groups $DB_{21}$, $DB_{22}$, and $DB_{31}$, $DB_{32}$ along the word line direction. Namely, the data bus $DB_2$ shown in FIG. 3 is divided into the data buses $DB_{21}$, $DB_{22}$, and the bus $DB_3$ shown in FIG. 3 is divided into the data buses $DB_{31}$, $DB_{32}$. The data buses $DB_{21}$ and $DB_{31}$ are connected to a first data latch circuit DL through first data bus lines $l_{12}$ and $l_{13}$ running along the bit line direction and switching circuit SW, similarly, the data buses $DB_{22}$ and $DB_{32}$ are connected to a second data latch circuit DL through second data bus lines $l_{12}$ and $l_{13}$ running along the bit line direction and switching circuit SW. The first and the second data bus lines $l_{12}$ and $l_{13}$ are provided above memory cells MC and the sense amplifiers SA crossing the data buses $DB_{21}$, $DB_{22}$ and $DB_{31}$, $DB_{32}$.

Furthermore, as shown in FIG. 7, sense amplifier driving lines $l_1$ and $l_2$ running in the word line direction (lengthwise direction) are connected to power supply lines Vcc and Vss at a plurality of connection portions by a plurality of wirings extending over the memory cell array and the sense amplifiers.

Figure 8A:
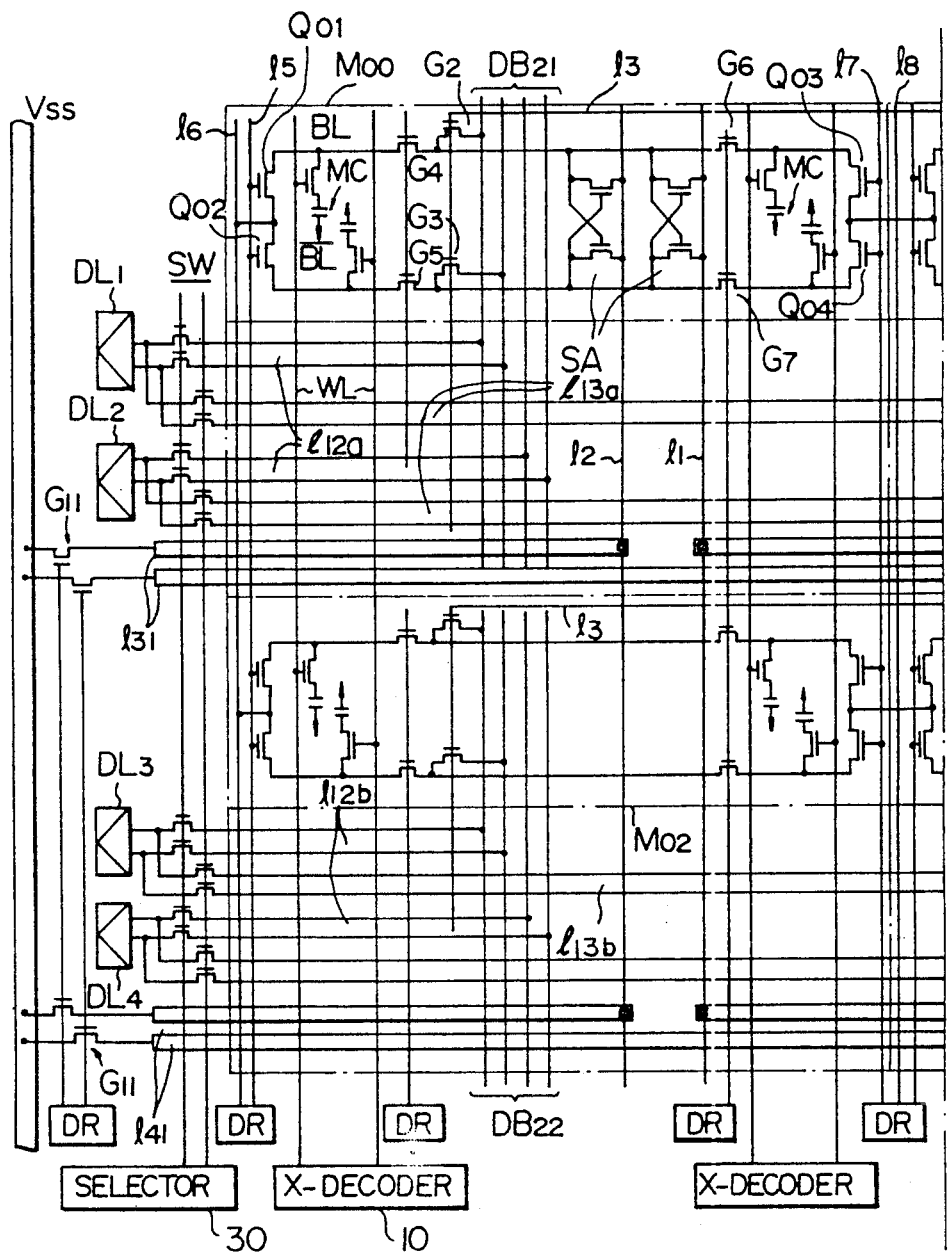
FIG. 8 made up of FIGS. 8A and 8B is a circuit diagram indicating the second embodiment of the semiconductor memory device according to the present invention.
Figure 8B:
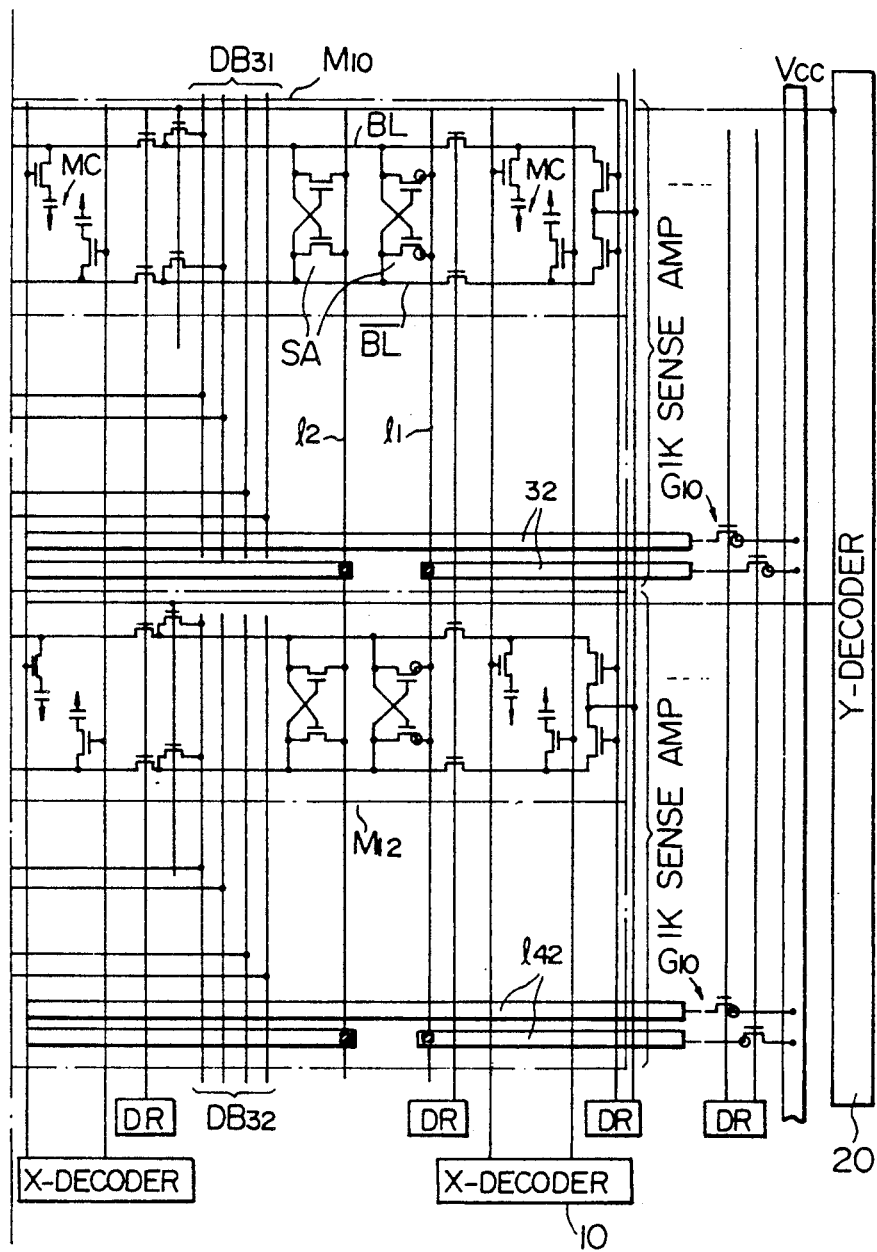

FIG. 8 is a circuit diagram indicating the second embodiment of the semiconductor memory device according to the present invention. The semiconductor memory device of FIG. 8 is the same large capacity memory device of the 16M-bit DRAM shown in FIG. 6. In FIG. 8, a sense amp line (which is constituted by 2K (2048) sense amplifiers arranged as a line-shape in the lengthwise direction) are divided into two sense amp lines each having 1K (1024) sense amplifiers. This semiconductor memory devise is also a DRAM of a four-bit simultaneous read out type and eight data bus lines are required, but there are only four bus lines (two pairs) for each divided sense amp line.

In FIG. 8, lines $l_{12a}$, $l_{13a}$ and $l_{12b}$, $l_{13b}$ are connected to data latch circuits $DL_1$, $DL_2$ and $DL_3$, $DL_4$ through switching transistors SW which are controlled by a selector circuit 30, and latched data in each of the data latch circuits $DL_1$, $DL_2$, $DL_3$, and $DL_4$ are output externally through a specific path (which is not shown in the drawings). Note, when the left sense amp line operates, the right sense amp line does not operate. Conversely, when the right sense amp line operates, the left sense amp line does not operate. Therefore, the same data latch circuit $DL_1$, $DL_2$, $DL_3$, and $DL_4$ can be used for both left and light sense amp lines.

The sense amplifier driving lines $l_1$ and $l_2$ of both left and right sense amp lines are connected to the low potential power supply line Vss and the high potential power supply line Vcc through sense amplifier driving lines $l_{31}$, $l_{32}$ and $l_{41}$, $l_{42}$ running in the lateral direction and gate transistors $G_{11}$ and $G_{10}$, respectively. Namely, the sense amplifier driving line $l_1$ is connected to the high potential power supply line Vcc through the sense amplifier driving lines $l_{32}$ and $l_{42}$ and the gate transistors $G_{10}$, and the sense amplifier driving line $l_2$ is connected to the low potential power supply line Vss through the sense amplifier driving lines $l_{31}$ and $l_{41}$ and the gate transistors $G_{11}$. Note, each one sense amplifier driving line $l_1$ is connected to the power supply line Vcc by a plurality of (two) driving lines $l_{32}$ and $l_{42}$, and each one sense amplifier driving line $l_2$ is connected to the power supply line Vss by a plurality of (two) driving lines $l_{31}$ and $l_{41}$, and a current in each of the sense amplifier driving lines $l_1$ and $l_2$ is divided and flown into both two driving lines $l_{32}$, $l_{42}$ and $l_{31}$, $l_{41}$. Therefore, a width of each of the sense amplifier driving lines $l_1$ and $l_2$ can be made small, and an occupancy area of the sense amplifier driving lines $l_1$ and $l_2$ can be decreased.

As described above, the sense amplifier driving lines $l_{31}$, $l_{32}$ and $l_{41}$, $l_{42}$ running in the lateral direction are provided in plural, and the sense amplifier driving lines $l_1$ and $l_2$ running in the lengthwise direction are supplied with the power Vss and Vcc through the plural driving lines, and thus the width of each driving lines $l_1$ and $l_2$ can be small.

When the sense amp lines are divided into two sense amp lines along the lengthwise direction in the 16M-bit DRAM device, the width of the data bus can be decreased to $384/2 = 192$ μm, and the width of the sense amplifier driving line can be decreased to $1280/2 = 640$ μm.

Figure 9:
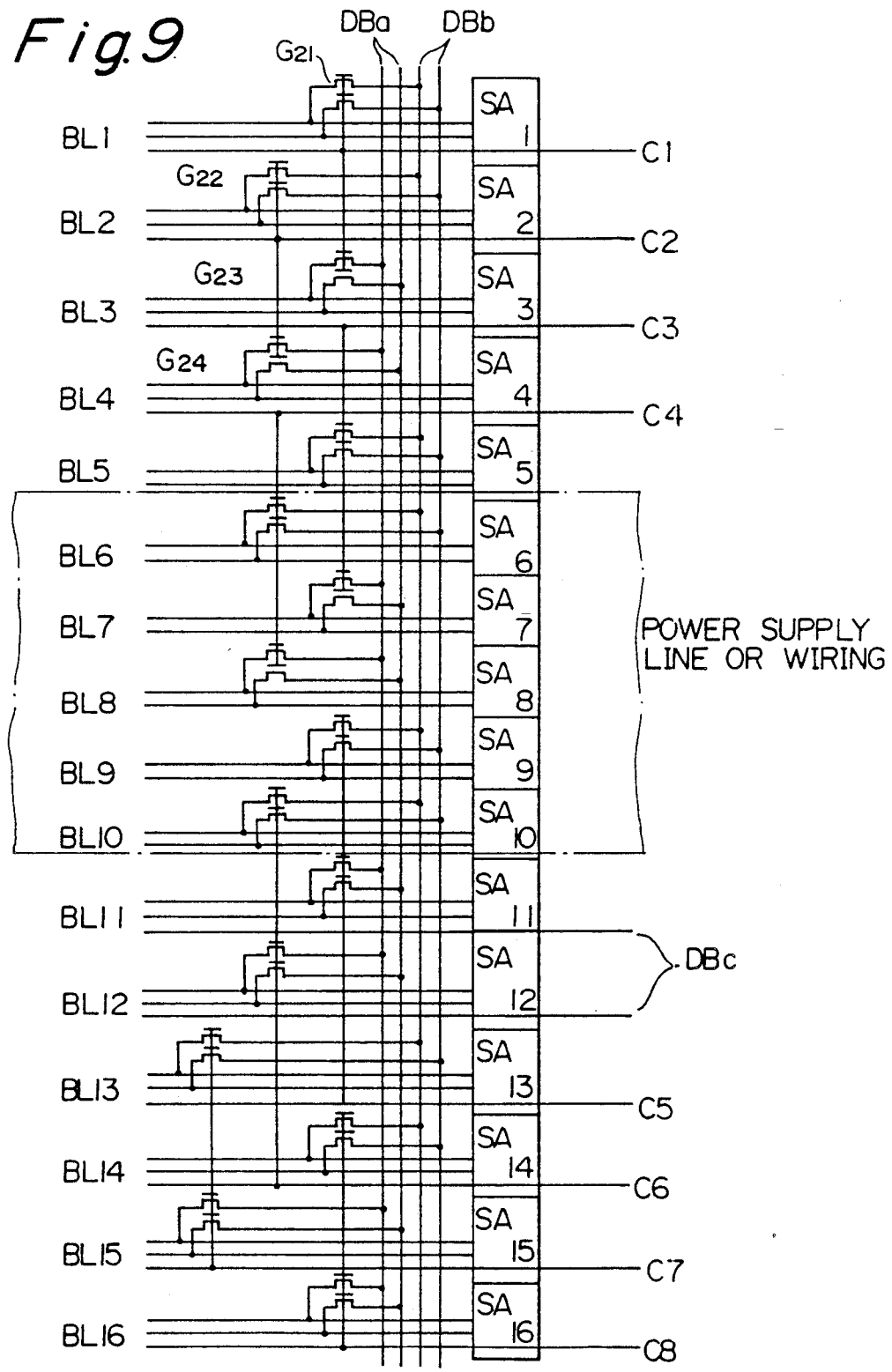
FIG. 9 is a block circuit diagram indicating a part of the semiconductor memory device shown in FIG. 8.

FIG. 9 is a block circuit diagram indicating a part of the semiconductor memory device shown in FIG. 8, and a layout of various wirings in a lateral direction in one group consisting of sixteen sense amplifiers is described therein. In FIG. 9, references $SA_1 \sim SA_{16}$ denote sixteen sense amplifiers, and $BL_1 \sim BL_{16}$ denote sixteen pairs of word lines. Further, references C1, C2, . . . denote column select lines, $G_{21}$, $G_{22}$, . . . denote column select gate transistors, which are indicated by the reference $l_3$ and $G_2$, $G_3$ in FIG. 8. Additionally, references DBa and DBb denote four data bus pairs $DB_{21}$, . . .

Two pairs of bit lines are connected to the corresponding data bus pairs DBa and DBb by one of the column select lines C1, C2, . . . , and four-bit data are simultaneously read out or written by sixteen sense amp lines which are not shown. In this embodiment, the bit line pairs BL1 and BL3 are controlled and connected to the data bus pairs DBa and DBb by the column select line C1, the bit line pairs BL2 and BL4 are controlled and connected to the data bus pairs DBb and DBa by the column select line C2, and the others bit line pairs are also controlled and connected to the corresponding data bus pairs by the column select lines in the same manner as above.

When one lateral direction wiring (column select line) is running over one sense amplifier, sixteen lateral direction wirings can be provided over sixteen sense amplifiers $SA1 \sim SA16$. Note, one column select line $C1 \sim C8$ processes two bit-line pairs $BL1 \sim BL16$ and eight column select lines are enough, and thus a space corresponding to eight wiring lines, which are provided over the sense amplifiers $SA5 \sim SA12$ in FIG. 9, can be kept. Namely, in this embodiment, the column select lines are provided at the upper portion by four lines C1 $\sim$ C3 and at the lower portion by four lines C5 $\sim$ C8. Therefore, the space corresponding to eight lines at the center portion remains, and the power supply lines Vss, Vcc, the other signal lines (for example, the line $l_{31}$ in FIG. 8), or the data bus DBc (for example, the line $l_{12a}$, $l_{13a}$; $l_{12b}$, $l_{13b}$ in FIG. 8) can be provided for the eight remaining lines at the center portion.

As described above, in accordance with the second embodiment of the present invention, the width of the data buses and the sense amplifier driving lines running along the sense amp line (lengthwise direction) can be decreased, especially in a large capacity semiconductor memory device, and the occupancy area thereof can be extremely decreased.

Figure 10A:
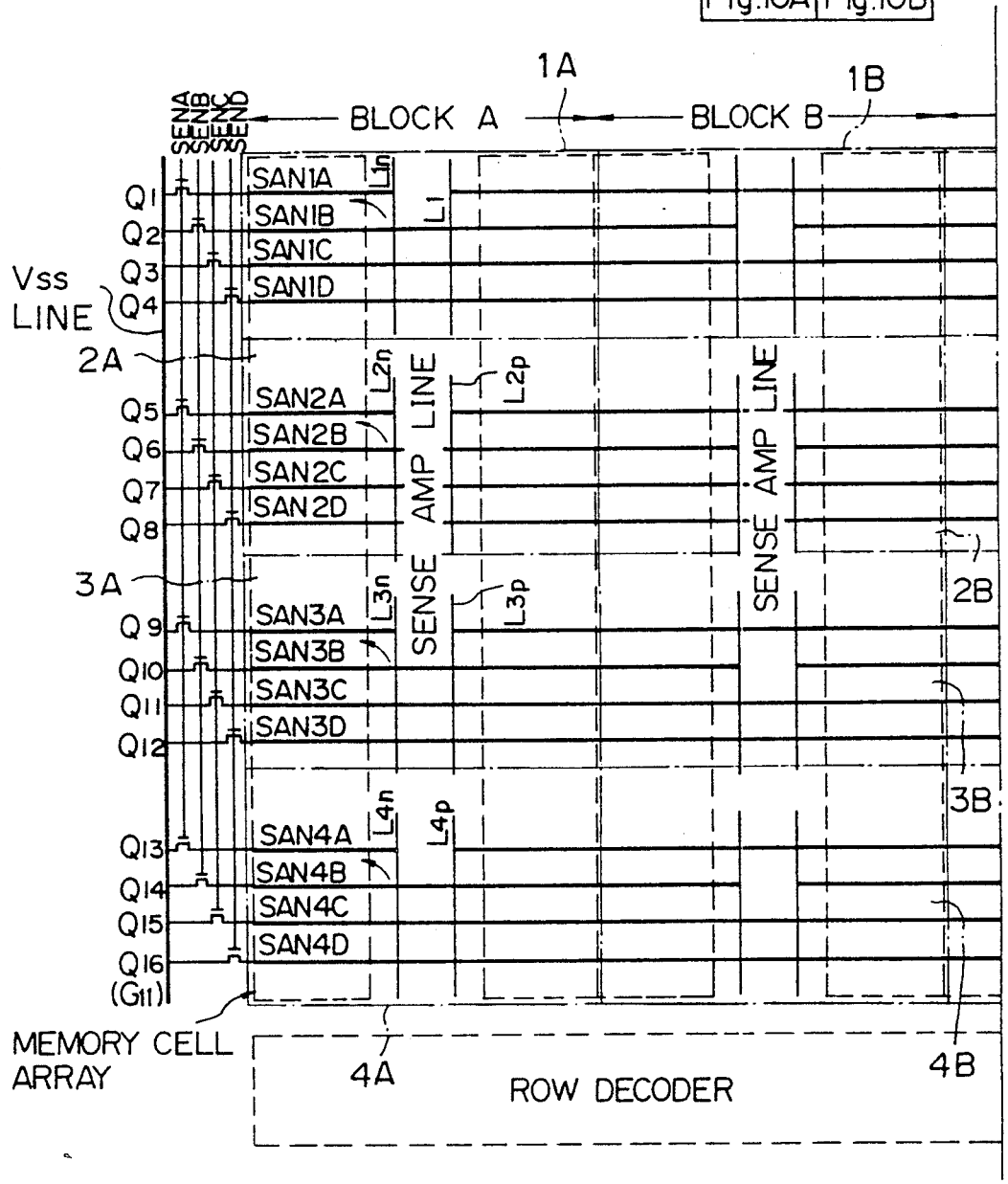
FIG. 10 made up of FIGS. 10A and 10B is a circuit diagram indicating a third embodiment of a semiconductor memory device according to the present invention.
Figure 10B:
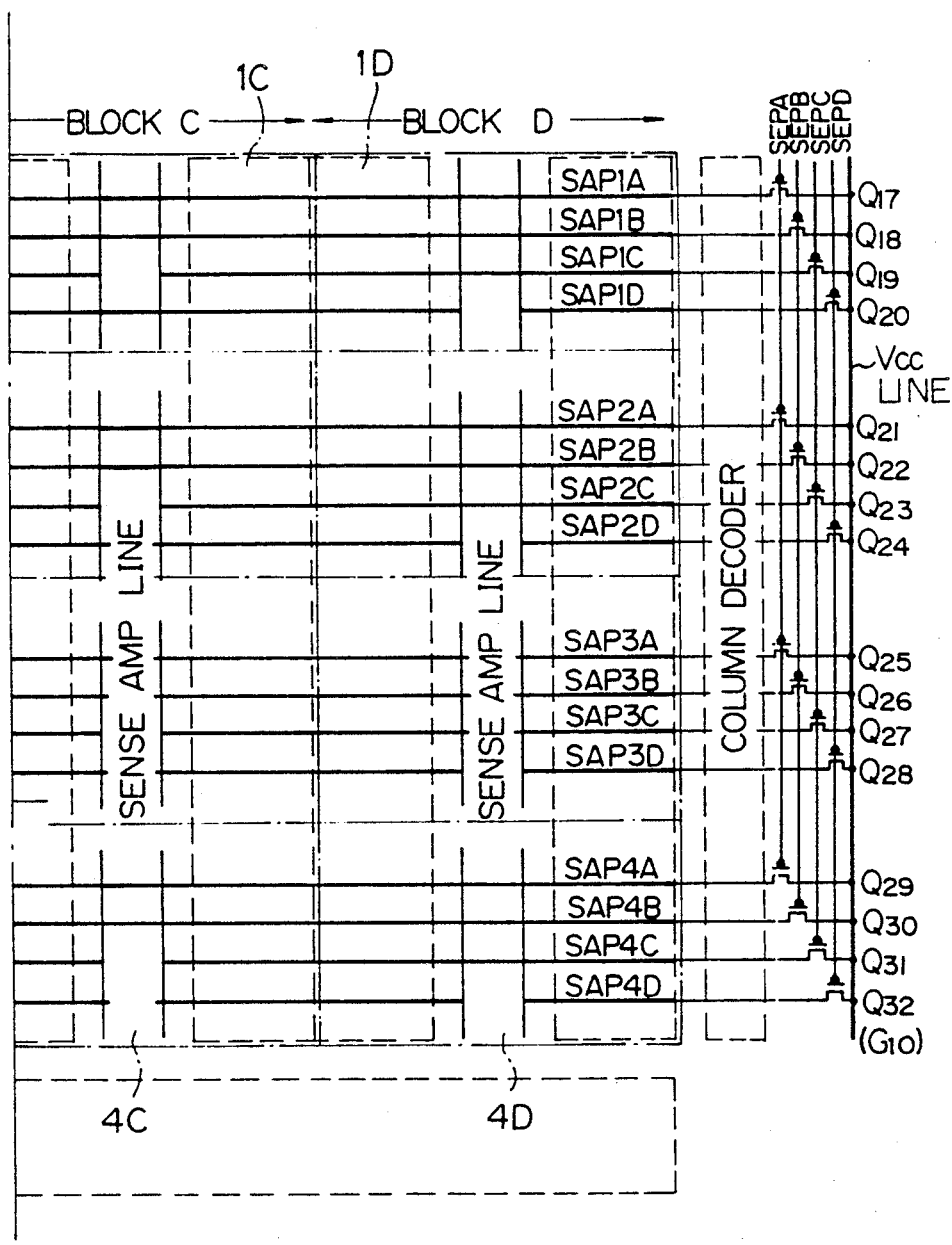

FIG. 10 is a circuit diagram indicating a third embodiment of a semiconductor memory device according to the present invention. In FIG. 10, all memory cells are divided into four blocks A $\sim$ D in the bit line direction (lateral direction), and each block A $\sim$ D is divided into four units (blocks) along the word line direction (lengthwise direction), for example, the block A is divided into units 1A, 1B, 1C and 1D. Note, each block A $\sim$ D includes a sense amp line where a plurality of sense amplifiers are arranged as a line-shape in the lengthwise direction, and two memory cell lines (blocks) in the lengthwise direction each having a plurality of memory cells. The two memory cell blocks are provided on both sides of the sense amp line. In the practical use, however, the memory cells are not divided into only four blocks in each direction, but are divided into 32 or 64 blocks in each direction.

As shown in FIG. 10, in each block A $\sim$ D, each of the sense amplifier driving lines Ln and Lp running along the lengthwise direction is divided into four wirings (sense amplifier driving lines) $L1n \sim L4n$ and $L1p \sim L4p$, respectively. The wirings $L1n \sim L4n$ are connected to the corresponding wirings (sense amplifier driving lines) SAN1A $\sim$ SAN4A running along the lateral direction, and the sense amplifier driving lines $L1p \sim L4p$ are connected to the corresponding wirings SAP1A $\sim$ SAP4A running along the lateral direction. Note, the wirings SAN1A $\sim$ SAN4A and SAP1A $\sim$ SAP4A are formed in a wiring layer which is another layer having the wirings $L1n \sim L4n$ and $L1p \sim L4p$, and thus the wirings SAN1A $\sim$ SAN4A, SAN1B $\sim$ SAN4B, SAN1C $\sim$ SAN4C, SAN1D $\sim$ SAN4D and the wirings $L1n \sim L4n$ and $L1p \sim L4p$ can be formed the same as the circuit diagram shown in FIG. 10. For example, the wirings SAN1D $\sim$ SAN4D for connecting between the sense amplifiers (SA) in the block D and the low potential power supply line Vss can be formed over the blocks A, B and C, and the wirings SAP1A $\sim$ SAP4A for connecting between the sense amplifiers in the block A and the high potential power supply line Vcc can be formed over the blocks B, C and D. Note, the wirings $L1n \sim L4n$ (Ln) and $L1p \sim L4p$ (Lp) are formed over the sense amp line, and the occupancy area for the sense amp line is limited by the size of the wirings $L1n \sim L4n$ (Ln) and $L1p \sim L4p$ (Lp).

In the conventional semiconductor memory device, when the sense amplifier driving lines Ln and Lp are running along the word line direction (sense amp line direction) as shown in FIG. 2, all sense amplifiers in the sense amp line are driven by the same driving lines Ln and Lp. Note, the width of the driving lines Ln and Lp close to the power lines Vss and Vcc should be made large, as the currents flowing in all the sense amplifiers in the sense amp line are flown to the power lines Vss and Vcc through the driving lines Ln and Lp close to the power lines Vss and Vcc. However, in the present embodiment, the sense amplifier driving lines Ln and Lp in FIG. 2 are divided into four wirings $L1n \sim L4n$ and $L1p \sim L4p$, and each of the wirings $L1n \sim L4n$ and $L1p \sim L4p$ is connected to the low potential power supply line Vss and the high potential power supply line Vcc running along the word line direction through the corresponding wirings SAN1A $\sim$ SAN4A and SAP1A $\sim$ SAP4A. Therefore, a width of each sense amplifier driving line $L1n \sim L4n$ and $L1p \sim L4p$ can be decreased by the number of its driving sense amplifiers. Namely, in the conventional art, all sense amplifiers in the sense amp line are driven by the same sense amplifier driving line (Ln, Lp), and thus a width of the sense amplifier driving line (Ln, Lp) becomes large in order to flow a sufficient current to the sense amplifiers connected thereto. Nevertheless, in the present embodiment, the sense amplifiers in each sense amp line are divided into four blocks (units 1A $\sim$ 1D), the sense amplifier driving line Ln and Lp are also divided into four wirings $L1n \sim L4n$ and $L1p \sim L4p$, and these wirings $L1n \sim L4n$ and $L1p \sim L4p$ are supplied with the low and voltage Vss and Vcc through corresponding wirings SAN1A $\sim$ SAN4A and SAP1A $\sim$ SAP4A. Therefore, in the present embodiment, the width of the sense amplifier driving lines L1n~L4n and L1p~L4p becomes small, and the occupancy area of the sense amp line over which the wirings L1n~L4n and L1p~L4p are formed becomes small.

Additionally, in the present embodiment, the power supply lines Vss and Vcc formed in the circumference of the memory portion along the lateral direction (bit line direction) can be deleted by using power supply lines Vss and Vcc formed in the circumference of the memory portion along the lengthwise direction (word line direction, or sense amp line direction) and the wirings SAN1A~SAN4A and SAP1A~SAP4A running along the lateral direction. Note, the length of the memory cell portion in the lateral direction is longer than the length of the memory cell portion in the lengthwise direction and the wirings SAN1A~SAN4A and SAP1A~SAP4A are formed over the memory cell portion, so that the occupancy area for the power supply lines become small.

In FIG. 10, references $Q_1$~$Q_{16}$ denote sense amplifier driving transistors (gate transistors), and these transistors are normally switched OFF. When $\overline{RAS}$ signal is activated and an address for selecting a word line is defined, the word line which is discriminated is included in blocks A~D, and then one of four sense amplifier activation clocks SENA~SEND is generated. For example, when the word line in the block A are driven, the sense amplifier activation clock SENA is changed to a high level and the sense amplifier driving transistors $Q_1$, $Q_5$, $Q_9$, and $Q_{13}$ are switched ON, and then the sense amplifier driving lines SAN1A~SAN4A are connected to the low potential power supply line Vss, so that the sense amplifiers in the block A are only activated, and that the other sense amplifiers in the block B, C, and D are not activated. Note, when the sense amplifier activation clock SENA is changed, the corresponding activation clock SEPA is also changed and the sense amplifier driving transistors $Q_{17}$, $Q_{21}$, $Q_{25}$, and $Q_{29}$ are also switched ON, and then the sense amplifier driving lines SAP1A~SAP4A are connected to the high potential power supply line Vcc.

In the above descriptions, the width of one sense amplifier driving line SAN1A~SAN4A can be decreased in accordance with increasing the divided number thereof, and thus these sense amplifier driving lines can be formed in the same wiring layer where the data bus lines and the column select lines are formed.

Figure 11:
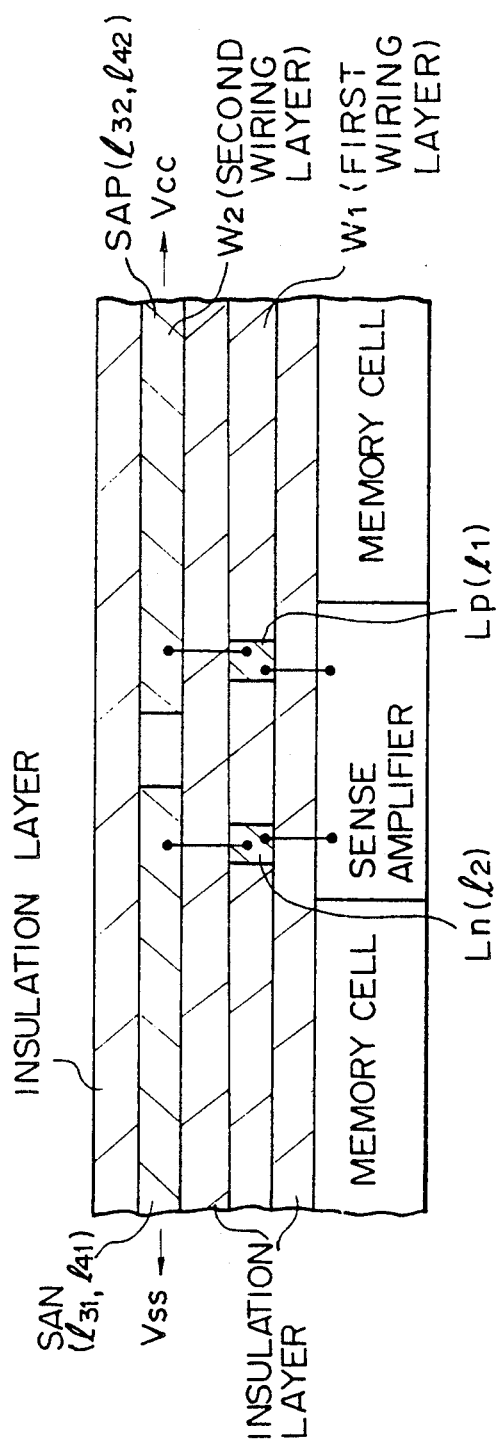
FIG. 11 is a sectional diagram indicating a part of the semiconductor memory device shown in FIG. 10.

FIG. 11 is a sectional diagram indicating a part of the semiconductor memory device shown in FIG. 10. As shown in FIG. 10, a plurality of sense amplifier driving lines running along the word line direction Ln, Lp (L1n~L4n, L1p~L4p; $l_2$, $l_1$) are formed in a first wiring layer $W_1$, and a plurality of second sense amplifier driving lines running along the bit line direction SAN1A~SAN4A, ..., SAP1A~SAP4A, ...; $l_{31}$, $l_{41}$, $l_{32}$, $l_{42}$) are formed in a second wiring layer $W_2$. Note, these wiring layers $W_1$ and $W_2$ are provided above the memory cell portion including a plurality of memory cells and sense amplifiers.

Figure 12A:
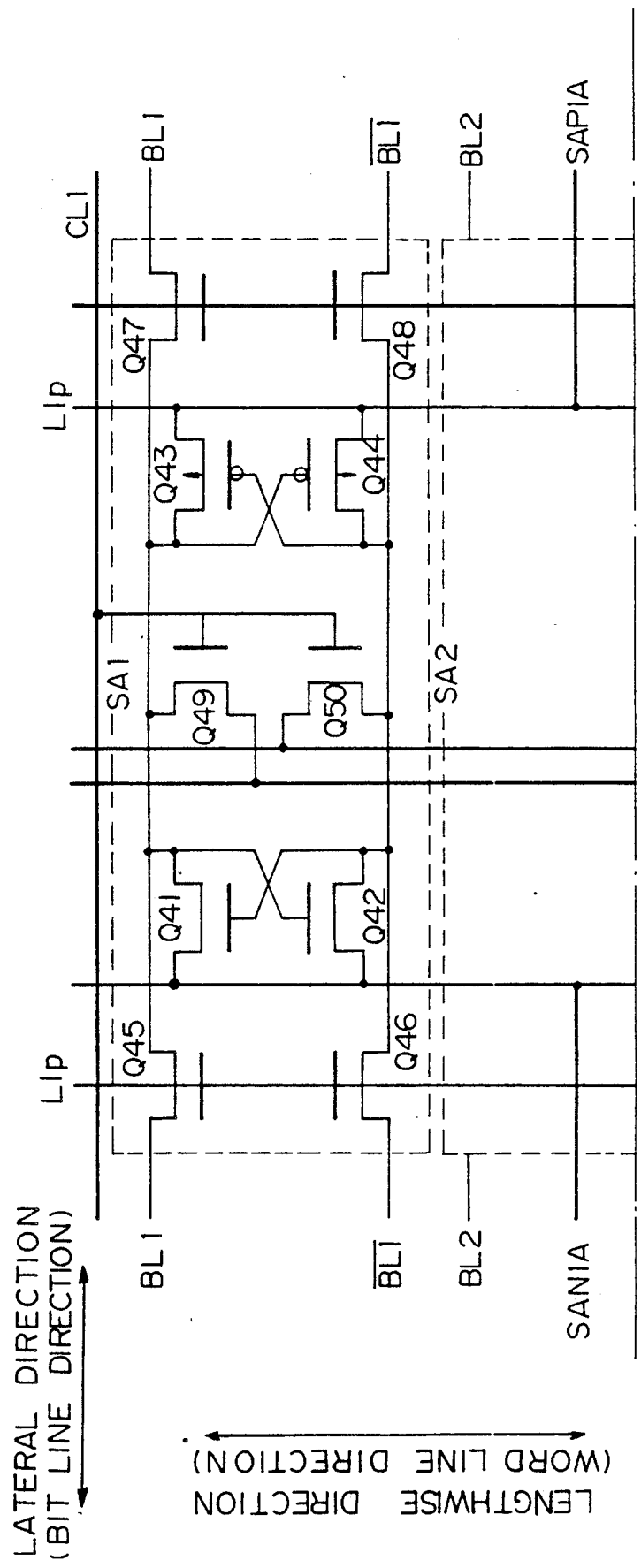
FIG. 12 made up of FIGS. 12A and 12B is a circuit diagram indicating a part of the semiconductor memory device shown in FIG. 10.

FIG. 12 is a sectional diagram indicating a part of the semiconductor memory device shown in FIG. 10.

In FIG. 12, references $Q_{41}$~$Q_{44}$ denote transistors constituting a sense amplifier (SA1), and references $Q_{49}$, $Q_{50}$ denote gate transistors for selecting a column and gates of the gate transistors $Q_{49}$, $Q_{50}$ are connected to an output CL1 of a column decoder provided at the end of the memory cell portion (memory cell array). The wiring CL1 is formed in the second aluminium wiring $W_2$ running along the bit line direction, or crossing direction of the word line. In FIG. 12, references $Q_{45}$~$Q_{48}$ denote switching transistors for a shared sense amplifier. Note, in the sense amplifier SA1, the sense amplifier driving lines L1n and L1p are running along the lengthwise direction and formed in the first aluminium wiring layer $W_1$. Note, a sense amplifier SA2 is the same configuration of the sense amplifier SA1, and the sense amplifier SA2 is not required at the portion close to the sense amplifier SA1. As shown in FIG. 12, in an area of the sense amplifier SA2, the sense amplifier driving lines SAN1A and SAP1A for driving the sense amplifiers provided in the block A (unit 1A) are formed, and these driving lines SAN1A and SAP1A are formed in the second wiring layer $W_2$ and connected to the sense amplifier driving lines L1n and L1p, respectively. A reference SA3 denotes a sense amplifier (shared sense amplifier) in the same block A, where the other sense amplifier driving line SAN1B for driving the sense amplifiers provided in the block B (unit 1B) is formed, and this driving line SAN1B is formed in the second wiring layer $W_2$ above the sense amplifier SA3 through an insulation layer.

As described above, the sense amplifier driving lines SAN1A~SAN4A, ..., SAP1A~SAP4A, ... running along the lateral direction are formed in the second wiring layer $W_2$ above the sense amplifier (SA), and thus the sense amplifier driving lines can be provided over the memory cell array, when the memory cell array is divided into a plurality of blocks in the bit line direction.

Figure 13A:
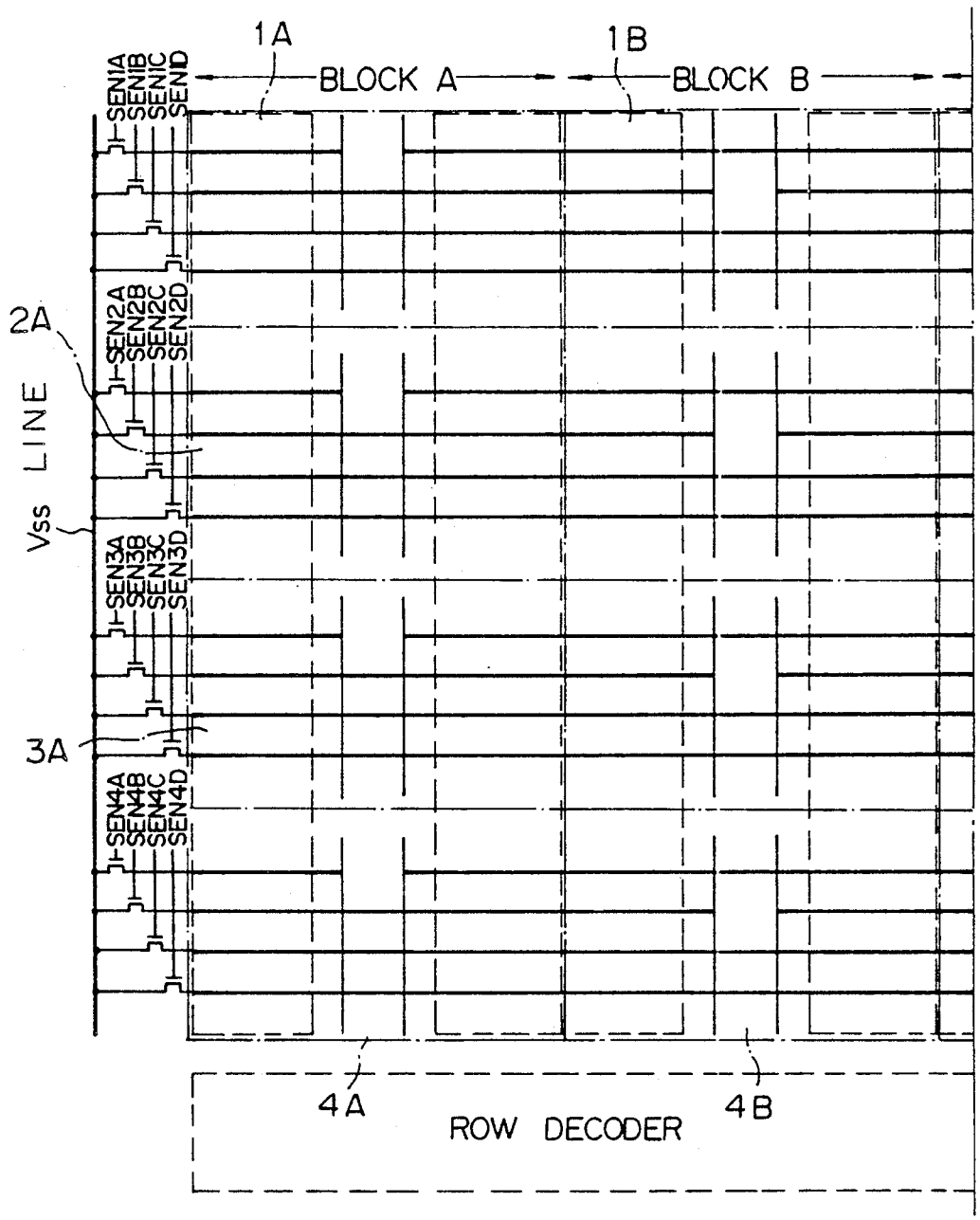
FIG. 13 made up of FIGS. 13A and 13B is a block circuit diagram indicating a modification of the third embodiment of the semiconductor memory device according to the present invention.
Figure 13B:
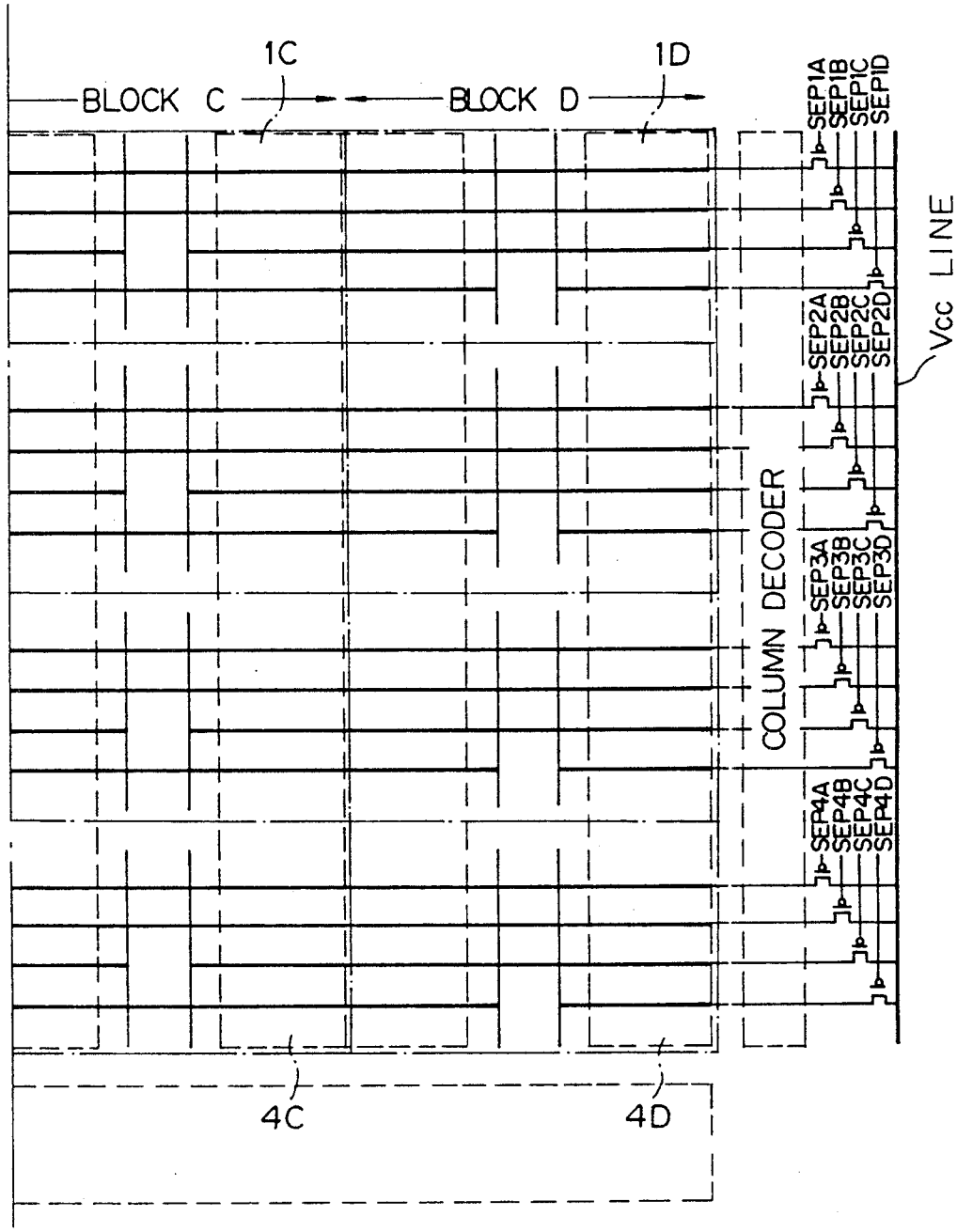

FIG. 13 is a block circuit diagram indicating a modification of the third embodiment of the semiconductor memory device according to the present invention.

In FIG. 13, the driving transistors for the sense amplifiers are divided into four blocks in the word line direction, and each driving transistor in the divided block is independently controlled by a sense amplifier activation clock. Namely, for example, the sense amplifier activation clock SENA for controlling the sense amplifier driving transistors $Q_1$, $Q_5$, $Q_9$, and $Q_{13}$ shown in FIG. 10 is divided into four sense amplifier activation clocks SEN1A~SEN4A. Note, for example, the sense amplifier driving transistor $Q_1$ is controlled by the sense amplifier activation clock SEN1A, and the sense amplifier driving transistor $Q_5$ is controlled by the sense amplifier activation clock SEN2A. Similarly, for example, the sense amplifier activation clock SEPA for controlling the sense amplifier driving transistors $Q_{17}$, $Q_{21}$, $Q_{25}$, and $Q_{29}$ shown in FIG. 10 is divided into four sense amplifier activation clocks SEP1A~SEP4A.

By dividing the sense amplifier activation clock dependently, for example, when accessing a first block (unit) 1A in the block A, in the semiconductor memory device shown in FIG. 10, the sense amplifier activation clock SENA is changed to a high level. However, in this semiconductor memory device shown in FIG. 13, the voltage values in the activation clock SEN1A for reading out operation and the activation clocks SEN2A~SEN4A for only a refreshing operation are different. SEN4A for only a refreshing operation are different. Namely, the voltage value of the activation clock SEN1A for a reading out operation is higher than that of the activation clocks for only a refreshing operation SEN2A~SEN4A. Note, the unit 1A is powerfully driven by the activation clock SEN1A, or the data bus for the unit 1A is driven by a low impedance (an internal resistance of the sense amplifiers in the unit 1A is a low value), so that an operation speed in the circuit for reading out data from the memory cell becomes high. Furthermore, the other units 2A~4A, where only a refresh operation is carried out, are weakly driven compared with the unit 1A, the operation in the units 2A~4A becomes slow. Therefore, a generated current at the beginning of the operations in the units 1A~4A can be small. In this embodiment, there are only four divided units (blocks), but practically, there may be 32 divided units. Namely, when all sense amplifiers are divided into 32 blocks, only 1/32 of all the blocks is required for a high speed operation (read out operation), and the other 31/32 blocks only carry out a refresh operation of the memory cell. Note, the average current, or the total current flowing in all the sense amplifiers is not changed, but the timing of current flowing in the sense amplifier for a reading out operation and the other sense amplifiers for only a refresh operation can be different, so that an internal noise and erroneous operation in the semiconductor memory device can be decreased.

FIG. 14 is a diagram indicating a timing chart for explaining an operation of a preferable sense amplifier for the semiconductor memory device shown in FIG. 13.

In FIG. 14, when changing a row address strobe $\overline{RAS}$ clock to a low level, a row address is fetched into a chip (semiconductor memory device) and a word line corresponding to the row address is selected, and each of the sense amplifier activation clocks SEN1A~SEN4A is changed to a high level. All selected sense amplifiers in the block A begin to operate at the same time by the sense amplifier activation clocks SEN1A~SEN4A. Note, a driving current flowing in each of the sense amplifiers is small and the operation speed thereof is slow, as all sense amplifiers in the block A are driven by approximately the same current value. The reason why the current value flowing in each of the sense amplifiers is approximately determined at the same value, is that a gate voltage of each sense amplifier driving transistor is limited to about half the value of the power supply voltage and each driving transistor begins to operate in a range similar to pentode characteristics of a vacuum tube having constant-current characteristics.

After changing the $\overline{RAS}$ clock to the low level and after about 20 nsec.~30 nsec., a column address strobe $\overline{CAS}$ clock is changed to a low level, so that a column address is fetched into the chip. In this case, an attribute block of the accessing column can be recognized, and thus a voltage value of the operation and the sense amplifier activation clock SEN1A, which is supplied to the gate of the sense amplifier driving transistor for driving or selecting, is determined to a higher level than that of the other clocks SEN2A~SEN4A which is supplied to the gate of the sense amplifier driving transistor for only refreshing and nonselecting. This selection operation is carried out by decoding a part of the column address. For example, when there are four divided blocks are four, the two bits of the column address are decoded, and when there are 32 divided blocks, the five bits of the column address are decoded, as 32 is indicated by $2^5$. Therefore, the sense amplifier in only one unit (block) 1A is driven by a high speed operation. Note, an amplitude of the bit line in the unit 1A is larger or higher than that of the other units 2A~4A. Further, the operation speed of selecting block is higher than that of the column decoder, as a bit number for decoding in the column decoder is more than a decoded bit number for selecting a block.

As described above, the sense amplifier in the unit 1A powerfully drives the column switch ($Q_{49}$ and $Q_{50}$ in FIG. 12) corresponding to the accessing column, and the sense amplifier powerfully drives the data bus lines, so that the circuits from a memory cell array to a data output amplifier can be driven first. On the other hand, the sense amplifiers in nonselected units 2A~4A are slowly (weakly) driven, and thus the current flowing in the sense amplifiers is not large at the beginning of the operations. Note, in the nonselected units 2A~4A, only a refresh operation is carried out therein until the RAS-cycle being completed.

Concretely, the sense amplifiers in the nonselected units are adequate for carrying out the amplifying operation during a long time of 40 nsec.~50 nsec. In this embodiment, the sense amplifier flowing current is not flown at the beginning of the operation, but is flown on average.

FIG. 15A is a circuit diagram indicating an example of a driving signal generation circuit for a sense amplifier, and FIG. 15B is a diagram indicating a timing chart explaining an operation of the driving signal generation circuit shown in FIG. 15A.

As shown in FIGS. 15A and 15B, an $\overline{SE}$ clock is the sense amplifier driving signal and is normally at a high level (Vcc), which is generated by using the $\overline{RAS}$ clock. A transistor $Q_{100}$ is switched ON by the $\overline{SE}$ clock, and the clock SEN1A is generated at a specific level lower by the threshold values of the transistor $Q_{101}$, $Q_{102}$ than the Vcc level, and thus the sense amplifier is weakly (slowly) driven. The column address is decoded and an access block (selected block) is recognized, a block selection signal BS1 in the access block is changed to the Vcc level, and an output of a NAND gate G1 is changed to a low level (Vss). Therefore, a transistor $Q_{104}$ is switched ON, the clock SEN1A is changed to the Vcc level, and thus the sense amplifier in the unit 1A is highly (powerfully) driven. In the blocks 2A~4A where only a refresh operation is carried out, the block selection signal is maintained at the Vss level, and thus an operation speed of the transistors corresponding to the transistor $Q_{104}$ is maintained to be slow.

Figure 16A:
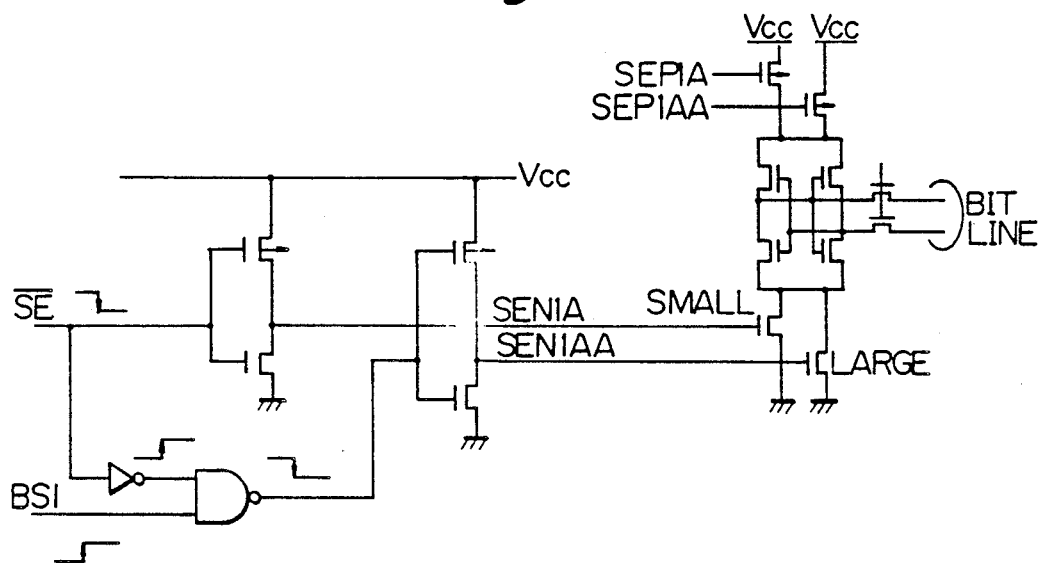
FIG. 16A is a circuit diagram indicating another example of a driving signal generation circuit of a sense amplifier.
Figure 16B:
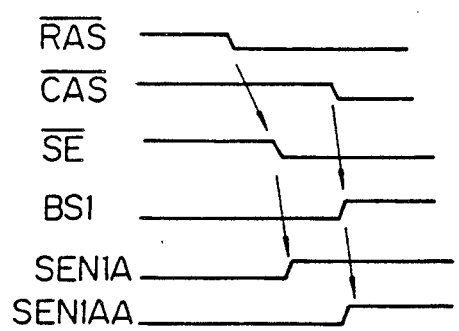
FIG. 16B is a diagram indicating a timing chart explaining an operation of the driving signal generation circuit shown in FIG. 16A.

FIG. 16A is a circuit diagram indicating the other example of a driving signal generation circuit of a sense amplifier, and FIG. 16B is a diagram indicating a timing chart explaining an operation of the driving signal generation circuit shown in FIG. 16A.

As described above with reference to FIGS. 15A and 15B, the operation speed of the selected sense amplifier can be different from that of the nonselected sense amplifiers by varying the gate voltages of the driving transistors. Nevertheless, in FIGS. 16A and 16B, the sense amplifier driving transistor is constituted by two different size transistors. Namely, the sense amplifier can be driven by both large size transistors and small size transistors. Note, the large size transistors are controlled by the sense amplifier driving clock SEN1AA (and SEP1AA), and the small size transistors are controlled by the sense amplifier driving clock SEN1A (and SEP1A). Note, in this driving signal generation circuit, at the beginning of the operation, the sense amplifiers in all units 1A~4A are driven by the small size transistors by receiving the driving clock SEN1A, after outputting the block select signal, the sense amplifier corresponding the selected unit 1A is driven by the large size transistors by receiving the driving clock SEN1AA.

FIG. 17 is a diagram indicating a timing chart for explaining an operation of the semiconductor memory device of a Pseudo Static type.

As shown in FIG. 17, in the Pseudo Static type DRAM device, an address multiplex operation is not carried out when a $\overline{CS}$ clock corresponding to the $\overline{RAS}$ clock changes to a low level, and addresses of both row side and column side are fetched into the chip. Note, in the Pseudo Static type DRAM, the sense amplifiers can be divided into a high speed operation unit and low speed operation units where only refresh operations are carried out at the beginning of the operations, as a accessing column block (selected column block) is defined at the beginning of the operations. The other operations are the same as in FIG. 14.

As described above, according to the third embodiment of the present invention, the width of one sense amplifier driving lines can be decreased in accordance with increasing the divided number thereof, and thus the width of the sense amplifier driving lines, or the occupancy area of the sense amp line, running along the word line direction, can be decreased. Furthermore, the sense amplifier driving lines can be formed in the same wiring layer where the data bus lines and the column select lines are formed, and thus the occupancy area of the semiconductor memory device can be decreased. Additionally, by dividing the sense amplifier activation clocks dependently, the timing of current flowing in the sense amplifier for a reading out operation and the other sense amplifiers for only a refreshing operation can be different, so that an internal noise and errorneous operation in the semiconductor memory device can be decreased.

Incidentally, the capacity of DRAM devices has become large, and a memory cell of the DRAM is constituted by a solid structure of a three dimensional stacked capacitor cell. This stacked capacitor cell is useful for reducing an occupancy area of the memory cell without decreasing the capacitance thereof. In the circumference of the memory cell portion, a plurality of peripheral circuits, for example, a sense amplifier, a bit line driver, a row decoder, a column decoder, and the like, are provided. Note, these peripheral circuits are constituted by normal semiconductor elements whose height corresponds to a single layer, the memory cell is constituted by the three dimensional stacked capacitor cell whose height corresponds to a plurality of layers, and thus an excessive difference is caused at the border portion between the memory cell portion and the peripheral circuit portion.

Figure 18:
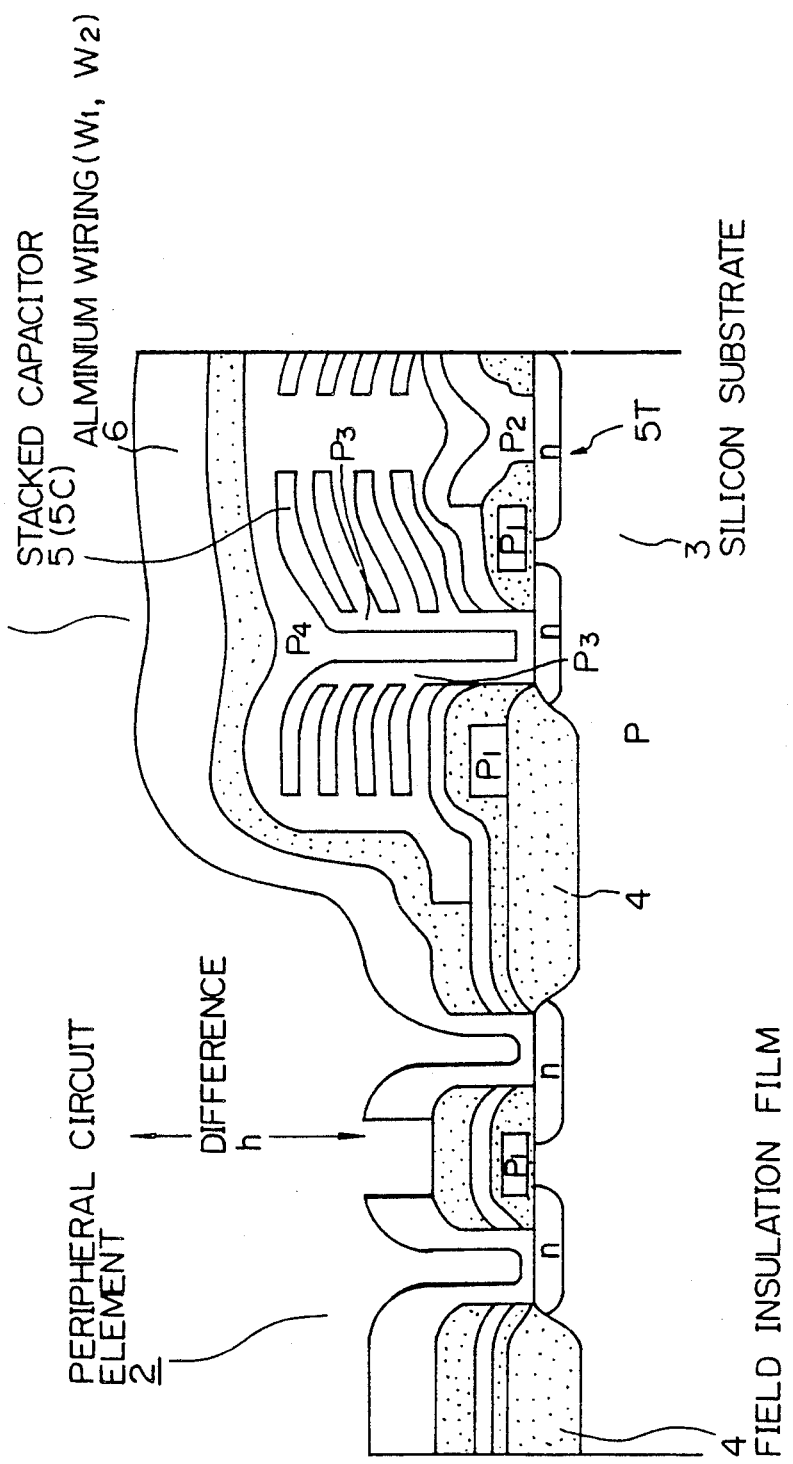
FIG. 18 is a sectional diagram indicating an aluminium wiring between a memory cell element and a peripheral circuit element according to a related art.

FIG. 18 is a sectional diagram indicating an aluminium wiring between a memory cell element and a peripheral circuit element according to a related art. Note, this aluminium wiring may be used as the data bus lines or sense amplifier driving lines running along the lateral direction (bit line direction) formed in the wiring layers $W_1$ or $W_2$ in FIG. 11.

In FIG. 18, reference numeral 1 denotes a memory cell element, 2 denotes a peripheral circuit element, 3 denotes a p-type silicon substrate, 4 denotes field insulation film, and 5 denotes a stacked capacitor. Note, reference numeral 6 denotes a peripheral circuit wiring of an aluminium wiring which is not only used as the data bus lines or sense amplifier driving lines running along the lateral direction, but also a wiring (peripheral circuit wiring) for connecting the peripheral circuit element 2 to another peripheral circuit element (not shown).

As shown in FIG. 18, in the conventional semiconductor memory device, a large level difference is caused at the border portion between the memory cell portion and the peripheral circuit portion. This level difference between the memory cell portion and the peripheral circuit portion cannot be included in a depth of focus of a exposure system. Therefore, the aluminium wirings cannot be freely formed over the memory cell portion and peripheral circuit portion with high accuracy, and thus an occupancy area of the DRAM device cannot be decreased.

Figure 19:
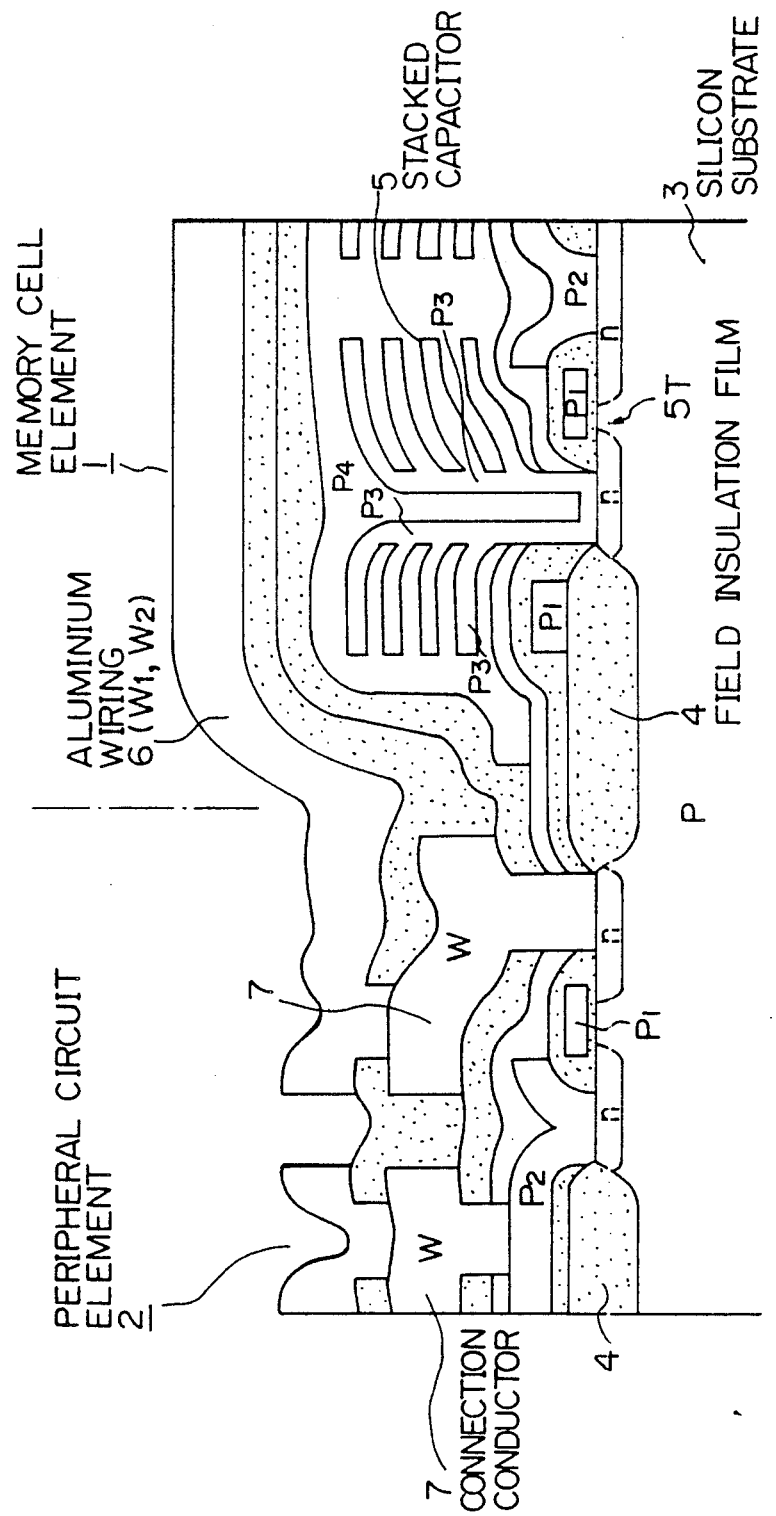
FIG. 19 is a sectional diagram indicating an aluminium wiring between a memory cell element and a peripheral circuit element according to the present invention.

FIG. 19 is a sectional diagram indicating an aluminium wiring between a memory cell element and a peripheral circuit element according to the present invention. In FIG. 19, reference numeral 1 denotes a memory cell element, 2 denotes a peripheral circuit element, 3 denotes a p-type silicon substrate, 4 denotes a field insulation film, 5 (5C) denotes a stacked capacitor, 6 denotes an aluminium wiring (data bus line, sense amplifier driving line, peripheral circuit wiring), 5T denotes a memory cell transistor, and 7 denotes a connection conductor of tungsten (W). Concretely, for example, when the memory cell element 1 is formed as 5000 Å and the connection conductor 7 is formed as 3000 Å onto the peripheral circuit element 2, the level difference between the memory cell portion and the peripheral circuit portion becomes 2000 Å, and the level difference can be included in a depth of focus of an exposure system. Therefore, the aluminium wirings can be freely formed over the memory cell portion and peripheral circuit portion with high accuracy, and thus an occupancy area of the DRAM device can be decreased. Namely, an occupancy area of the wirings can be decreased by forming the wirings over the memory cell portion and peripheral circuit portion, as described above with reference to FIGS. 3 to 10, and thus large scale integration of the DRAM device can be provided.

FIGS. 20A to 20G are sectional diagrams for explaining a method of forming the aluminium wiring between the memory cell element and the peripheral circuit element shown in FIG. 19.

First, as shown in FIG. 20A, a field insulation film 4 is formed on a p-type silicon substrate 3, and a gate electrode of a first polycrystal silicon film $P_1$ (whose thickness is about 100 Å) is formed on a silicon substrate 3 through a gate insulation film 11 (whose thickness is about 100 Å). Next, a source region S and a drain region D are formed by injecting arsenic ions into the silicon substrate 3 using the gate electrode and the field insulation film 4 as a mask. Furthermore, a silicon dioxide ($SiO_2$) film 12 is formed over the silicon substrate 3, contact holes are opened over the source region S, and a bit line of a second polycrystal silicon film $P_2$ coated by tungsten silicide is formed over the contact holes.

Next, as shown in FIG. 20B, a $Si_3N_4$ (silicon nitride) film 13 (whose thickness is about 500 Å) is formed over the $SiO_2$ film 12 and the second polycrystal silicon film $P_2$, or the silicon substrate 3, and then four $SiO_2$ films 14 and three polycrystal silicon films 15 are mutually formed. Furthermore, a hole for forming a contact portion of a stacked capacitor is opened through the $SiO_2$ films 14, the polycrystal silicon films 15, and the $Si_3N_4$ film 13 to the surface of the drain region D by using a lithography method, and a polycrystal silicon film 16 (whose thickness is about 1000 Å) is formed thereover, so that a tree-shape stacked capacitor is formed. Note, a total thickness from the surface of the substrate 3 to the top surface layer of the polycrystal silicon film 16, except for the $Si_3N_4$ film 13, is about 5000 Å.

Figure 20C:
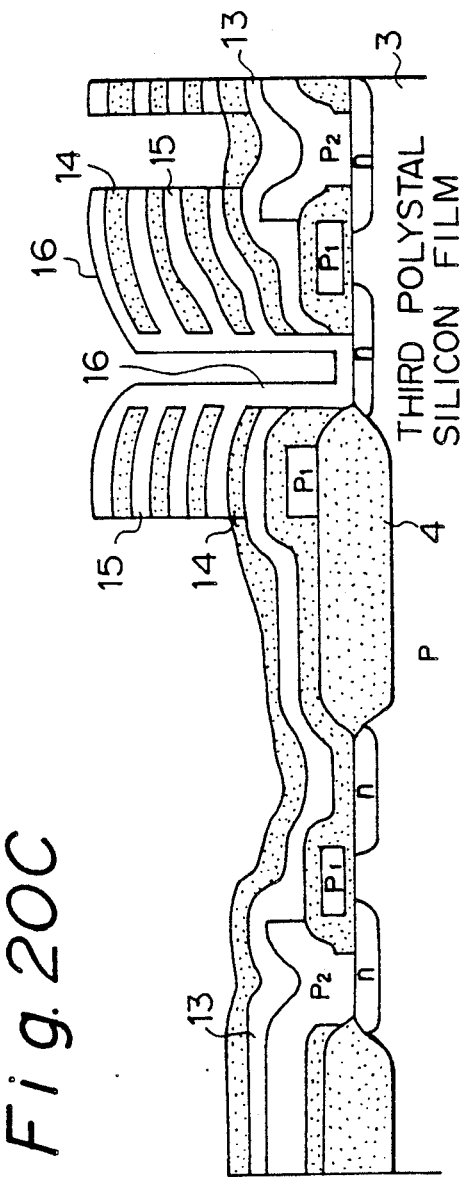
Figure 20D:
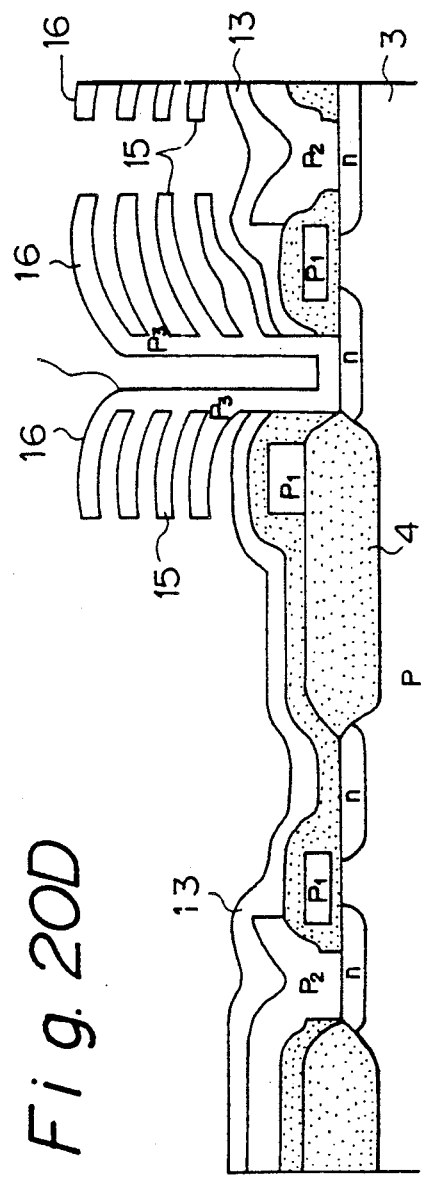

Furthermore, as shown in FIG. 20C, in the area without the stacked capacitor portion, the polycrystal silicon films 16, 15 and the $SiO_2$ films 14 except for the lowest $SiO_2$ film are removed by using the lithography method, so that the tree-shape stacked capacitor is formed. Next, as shown in FIG. 20D, in the area of the stacked capacitor portion, the $SiO_2$ films 14 provided between the polycrystal silicon films 16, 15 are removed by an etching method by immersion into a hydrofluoric acid solution, so that the tree-shape of polycrystal silicon films 16, 15 remain. This tree-shape of polycrystal silicon films 16, 15 is defined as a third polycrystal silicon film $P_3$. Note, in the manufacturing processes of the stacked capacitor, the $Si_3N_4$ film 13 is used to stop the etching process at the surface of the $Si_3N_4$ film 13.

Figure 20E:
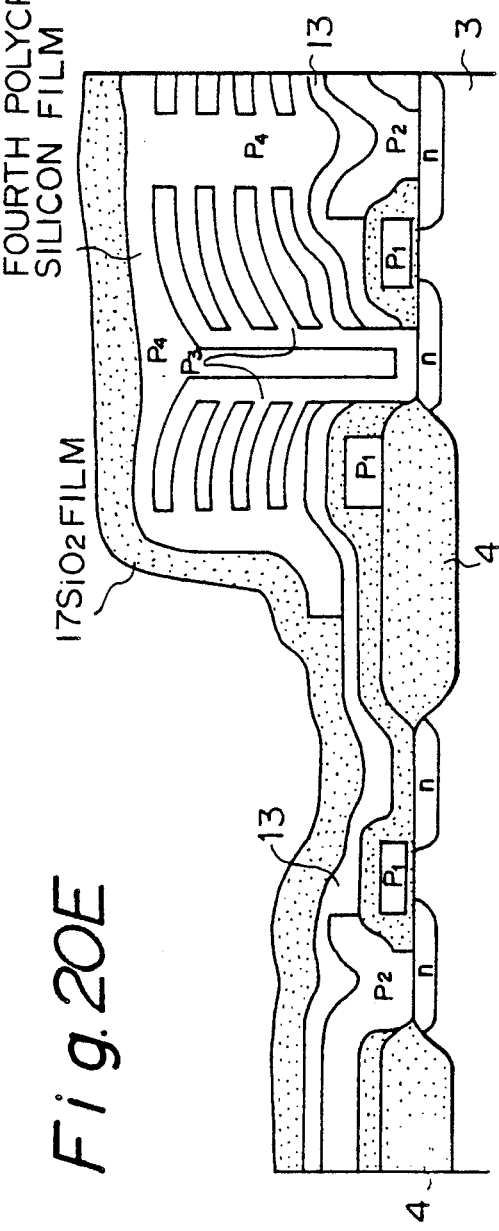

Next, as shown in FIG. 20E, a dielectric film (indicated by thick line) is formed onto the surface of the third polycrystal silicon film $P_3$ (tree-shape of polycrystal silicon films 16, 15) by using a thermal oxidation method, and then a fourth polycrystal silicon film $P_4$ (whose thickness is about 1000 Å) is formed thereover. Furthermore, in the area without the stacked capacitor portion, the fourth polycrystal silicon film $P_4$ is removed, and the remaining fourth polycrystal silicon film $P_4$ at the stacked capacitor portion becomes a cell plate. As described above, the stacked capacitor 5 is formed, and then a $SiO_2$ film 17 (whose thickness is about 1000 Å) is formed over the stacked capacitor 5.

Figure 20F:
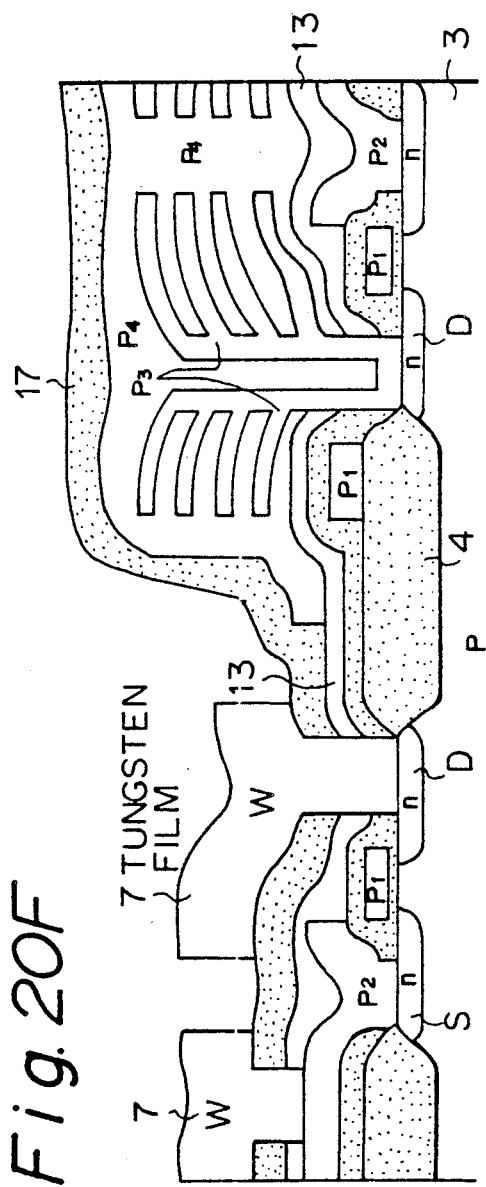

With reference to FIG. 20F, the main portions of the memory cell element 1 and the peripheral circuit element 2 are almost all formed, and next, contact holes are opened at the peripheral circuit element 2 through the $SiO_2$ film 17, the $Si_3N_4$ film 13 and the $SiO_2$ film 12 to the electrode portions. Furthermore, a tungsten (W) film 7 (whose thickness is about 3000 Å) is formed by using a chemical vapor deposition (CVD) method, and then the tungsten film 7 is patterned as a connection conductor by using the lithography method, so that the height of the connection electrodes becomes high.

Figure 20G:
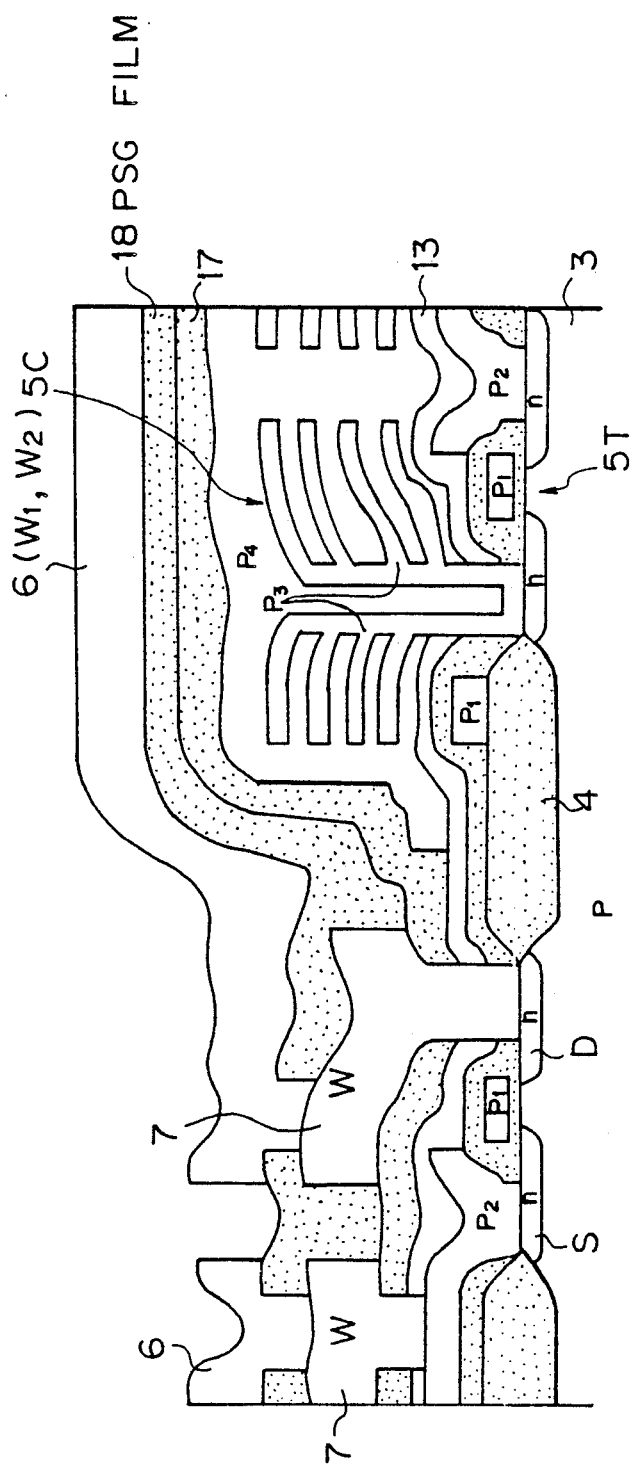

Finally, as shown in FIG. 20G, a phospho-silicate glass (PSG) film 18 formed onto the $SiO_2$ film 17 and the tungsten film 7, and then an aluminium wiring 6 is formed over the memory cell element 2, so that a data bus line, a sense amplifier driving line, or a peripheral circuit wiring can be formed. Namely, the aluminium wiring 6 is connected to the drain region D of the peripheral circuit element 2 through the connection conductor 7 of the tungsten film, so that the level difference between the memory cell portion and the peripheral circuit portion becomes small. Note, the level difference between the memory cell portion and the peripheral circuit portion can be included in a depth of focus of a exposure system, and thus the aluminium wirings can be freely formed over the memory cell portion and peripheral circuit portion with high accuracy. Consequently, an occupancy area of the wirings can be decreased by forming the wirings over the memory cell portion and the peripheral circuit portion, and thus large scale integration of the DRAM can be provided.

In the semiconductor memory device of the fourth embodiment of the present invention, the connection conductor 7 is not only limited to the tungsten film, but the connection conductor 7 can be made of polycrystal silicon, tungsten cilicide ($WSi_2$), and the like.

Many widely differing embodiments of the present invention may be constructed without departing from the spirit and scope of the present invention, and it should be understood that the present invention is not limited to the specific embodiments described in this specification, except as defined in the appended claims.

We claim:

1. A semiconductor memory device comprising:
   a plurality of word lines;
   a plurality of bit lines formed crossing said word lines;
   a plurality of memory cells, each connected between said one word line and said one bit line;
   a plurality of sense amplifiers, arranged along the word line direction;
   a first power supply line;
   a second power supply line;
   a plurality of first sense amplifier driving lines, connected to said sense amplifiers and formed in a first wiring layer; and
   a plurality of second sense amplifier driving lines, each connected between said corresponding first sense amplifier driving line and one of said first and second power supply lines, and formed in a second wiring layer.

2. A semiconductor memory device as claimed in claim 1, wherein said first sense amplifier driving lines are formed along the word line direction, and said second sense amplifier driving lines are formed along the bit line direction.

3. A semiconductor memory device as claimed in claim 1, wherein said first sense amplifier driving lines are connected to said first and second power supply line at a plurality of portions through a plurality of said second sense amplifier driving lines.

4. A semiconductor memory device as claimed in claim 1, wherein said sense amplifiers and said memory cells are divided into a plurality of blocks.

5. A semiconductor memory device as claimed in claim 4, wherein each of said second sense amplifier driving lines are connected to one of said first and second power supply lines through a gate transistor, so that one of said divided blocks is selected.

6. A semiconductor memory device as claimed in claim 4, wherein said sense amplifiers are arranged as a sense amplifier line of a line-shape along the word line direction, and said memory cells are divided into two groups provided for both sides of said sense amplifier line, in each of said blocks.

7. A semiconductor memory device as claimed in claim 4, wherein each of said blocks is divided into a plurality of units.

8. A semiconductor memory device as claimed in claim 7, wherein each of said first sense amplifier driving lines is divided into a plurality of first unit sense amplifier driving lines corresponding to said units, each of said second sense amplifier driving lines is divided into a plurality of second unit sense amplifier driving lines connected to said corresponding first unit sense amplifier driving lines.

9. A semiconductor memory device as claimed in claim 8, wherein each of said second unit sense amplifier driving lines is connected to said first and second power supply lines through a gate transistor.

10. A semiconductor memory device as claimed in claim 9, wherein said gate transistors connected to said corresponding second unit sense amplifier driving lines in the same divided block are controlled by the same control signal, so that one of said divided blocks is selected and the units in said selected block are selected at the same timing.

11. A semiconductor memory device as claimed in claim 9, wherein said gate transistors connected to said corresponding second unit sense amplifier driving lines in the same divided block are controlled by one read out signal and the other refresh signals, so that one unit including a memory cell for reading out in a selected block is read out at high speed and the other units in said selected block are only refreshed at different timing than the read out operation.

12. A semiconductor memory device as claimed in claim 11, wherein a voltage value of said read out signal is higher than that of said refresh signal, so that said read-out operation unit is speedily driven and said refresh operation unit are slowly driven.

13. A semiconductor memory device as claimed in claim 1, wherein said semiconductor memory device further comprises data bus lines and a data latch circuit, said data bus lines are connected between said sense amplifiers and said data latch circuit.

14. A semiconductor memory device as claimed in claim 13, wherein said data bus lines comprise first data bus lines connected to said sense amplifiers and formed in said first wiring layer along the word line direction, and second data bus lines connected between said corresponding first bus lines and said data latch circuit and formed in said second wiring layer along the bit line direction.

15. A semiconductor memory device as claimed in claim 13, wherein said second data bus lines are connected to a plurality of said first data bus lines and said data latch circuit through gate transistors, said gate transistors are controlled by a selector, so that one of said first data bus lines is selected and connected to said data latch circuit.

16. A semiconductor memory device as claimed in claim 13, wherein said first data bus lines are divided into a plurality of group bus lines, said second data bus lines and said data latch circuit are provided in accordance with the divided group bus lines, and said second data bus lines are connected to said corresponding group bus lines and said data latch circuit through a switching circuit, so that each one of said group bus lines is selected and connected to said each data latch circuit.

17. A semiconductor memory device as claimed in claim 1, wherein said semiconductor memory device comprises further signal lines formed in said first wiring layer and said second wiring layer.

18. A semiconductor memory device as claimed in claim 1, wherein said second sense amplifier driving lines are formed between a memory cell portion and a peripheral circuit portion, and said second sense amplifier driving lines are connected to said one of said first and second power supply lines through a connection conductor.

19. A semiconductor memory device as claimed in claim 1, wherein each of said memory cell comprises a stacked capacitor and a memory cell transistor.

20. A semiconductor memory device as claimed in claim 1, wherein said first wiring layer and said second wiring layer provided above said memory cells and said sense amplifiers are used to form data bus lines, sense amplifier driving lines, the other signal lines, and power supply lines.

21. A semiconductor memory device comprising:
a plurality of word lines;
a plurality of bit lines formed crossing said word lines;
a plurality of memory cells, each connected between said one word line and said one bit line;
a plurality of sense amplifiers, each connected to a pair of said bit lines;
a first power supply line;
a second power supply line; and
a pair of sense amplifier driving layers, connected between said first and second power supply lines and each of said sense amplifiers, and formed in a wiring layer over said memory cells and said sense amplifiers.

* * * * *